US011935833B2

(12) United States Patent
Biswas et al.

(10) Patent No.: US 11,935,833 B2
(45) Date of Patent: Mar. 19, 2024

(54) METHOD OF FORMING POWER GRID STRUCTURES

(71) Applicant: TAIWAN SEMICONDUCTOR MANUFACTURING COMPANY, LTD., Hsinchu (TW)

(72) Inventors: Hiranmay Biswas, Hsinchu (TW); Chi-Yeh Yu, Hsinchu (TW); Kuo-Nan Yang, Hsinchu (TW); Chung-Hsing Wang, Hsinchu (TW); Stefan Rusu, Hsinchu (TW); Chin-Shen Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/544,937

(22) Filed: Dec. 8, 2021

(65) Prior Publication Data

US 2022/0093513 A1 Mar. 24, 2022

Related U.S. Application Data

(62) Division of application No. 15/729,281, filed on Oct. 10, 2017, now Pat. No. 11,251,124.
(Continued)

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76816* (2013.01); *H01L 21/76877* (2013.01);
(Continued)

(58) Field of Classification Search
CPC .......... H01L 23/5286; H01L 21/76816; H01L 21/76877; H01L 23/5226; H01L 23/5283
(Continued)

(56) References Cited

U.S. PATENT DOCUMENTS 7,260,442 B2  8/2007 Hwang et al.
8,421,205 B2  4/2013 Yang
(Continued)

FOREIGN PATENT DOCUMENTS

JP  9-293843      11/1997
JP  2004-186671    7/2004
JP  2015-15502     1/2015

OTHER PUBLICATIONS

De Orio, Roberto Lacerda. "Electromigration Modeling and Simulation." Elecromigration Modeling and Simulation, Vienna University of Technology, Faculty of Electrical Engineering and Information Technology, Aug. 31, 2015, https://www.iue.tuwien.ac.at/phd/orio/node21.html, Internet Archive https://web.archive.org/web/20150831223409/http://www.iue.tuwien.ac.at/phd/orio/node26.html.
(Continued)

*Primary Examiner* — Xia L Cross
(74) *Attorney, Agent, or Firm* — Hauptman Ham, LLP

(57) ABSTRACT

A method of forming an IC structure includes forming first and second power rails at a power rail level. First metal segments are formed at a first metal level above the power rail level. Each first metal segment of the plurality of first metal segments overlap one or both of the first power rail or the second power rail. First vias are formed between the power rail level and the first metal level. Second metal segments are formed at a second metal level above the first metal level. At least one second metal segment of the plurality of second metal segments overlaps the first power rail. At least one second metal segment of the plurality of
(Continued)

second metal segments overlaps the second power rail. A plurality of second vias are formed between the first metal level and the second metal level.

20 Claims, 26 Drawing Sheets

Related U.S. Application Data

(60) Provisional application No. 62/427,630, filed on Nov. 29, 2016.

(51) Int. Cl.
*H01L 23/522* (2006.01)
*G06F 30/394* (2020.01)

(52) U.S. Cl.
CPC ...... *H01L 23/5226* (2013.01); *H01L 23/5283* (2013.01); *G06F 30/394* (2020.01)

(58) Field of Classification Search
USPC ........................................................ 257/572
See application file for complete search history.

(56) References Cited

U.S. PATENT DOCUMENTS

| | | |
|---|---|---|
| 8,661,389 B2 | 2/2014 | Chern et al. |
| 8,698,205 B2 | 4/2014 | Tzeng et al. |
| 8,826,212 B2 | 9/2014 | Yeh et al. |
| 8,836,141 B2 | 9/2014 | Chi et al. |
| 8,875,076 B2 | 10/2014 | Lin et al. |
| 9,147,029 B2 | 9/2015 | Ke et al. |
| 9,256,709 B2 | 2/2016 | Yu et al. |
| 2004/0094820 A1 | 5/2004 | Nishikawa et al. |
| 2008/0111158 A1 | 5/2008 | Sherlekar et al. |
| 2013/0154128 A1 | 6/2013 | Wang |
| 2014/0040838 A1 | 2/2014 | Liu et al. |
| 2014/0239406 A1 | 8/2014 | Tsuda et al. |
| 2014/0264924 A1 | 9/2014 | Yu et al. |
| 2014/0282289 A1 | 9/2014 | Hsu et al. |
| 2015/0278429 A1 | 10/2015 | Chang |
| 2015/0279453 A1 | 10/2015 | Fujiawara et al. |
| 2015/0318241 A1 | 11/2015 | Chang et al. |
| 2015/0347659 A1 | 12/2015 | Chiang et al. |
| 2015/0357279 A1 | 12/2015 | Fujiawara et al. |
| 2016/0012169 A1 | 1/2016 | Chiang et al. |
| 2016/0211212 A1* | 7/2016 | Chao .................. G06F 30/394 |

OTHER PUBLICATIONS

"Blech length," University of Cambridge, Dissemination of IT for the Promotion of Materials Science (DoITPoMS), Oct. 22, 2015, https://www.doitpoms.ac.uk/tlplib/electromigration/blech_length.php, Internet Archive https://web.archive.org/web/20151022042201/https://www.doitpoms.ac.uk/tlplib/electromigration/blech_length.php#expand.

"What is Electromigration?," May 26, 2013, https://blog.intgckts.com/what-is-electromigration/.

J.R. Lloyd, "Electromigration for Designers: An Introduction for the Non-Specialist," Apr. 12, 2002, https://www.eetimes.com/electromigration-for-designers-an-introduction-for-the-non-specialist/#.

Office Action dated Nov. 14, 2018 from corresponding application No. KR 10-2017-0155642.

Office Action dated Jun. 4, 2018 from corresponding application No. TW 106141047.

* cited by examiner

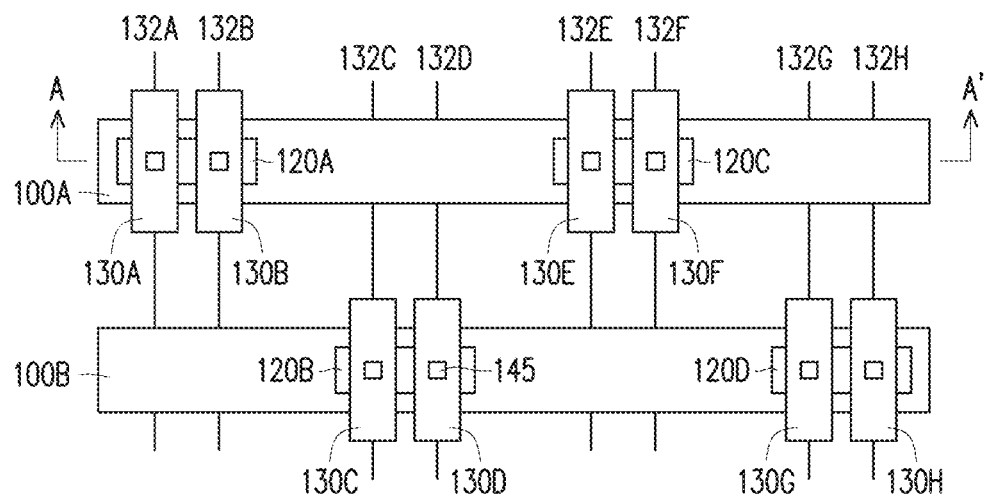
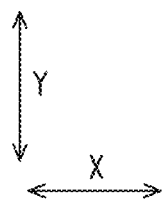
FIG. 1B

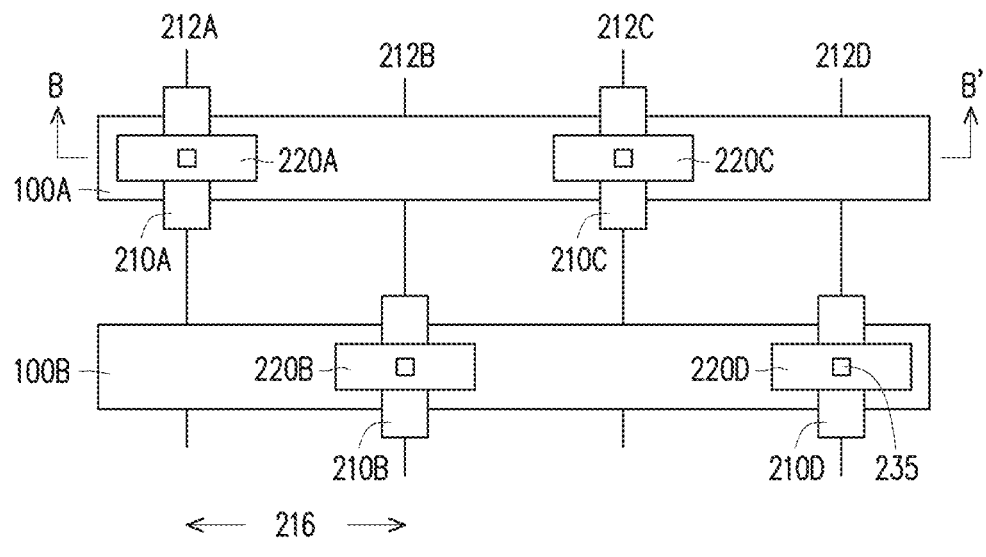
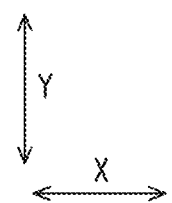
FIG. 2A

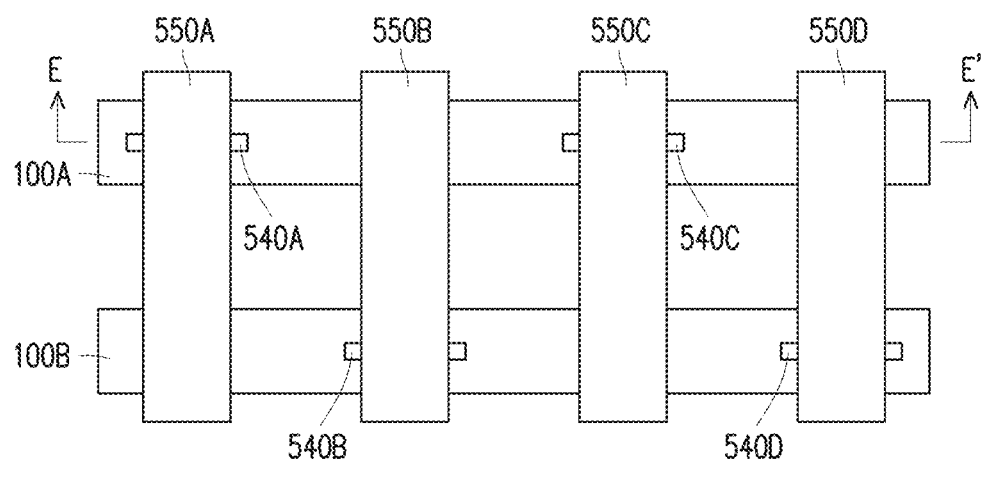
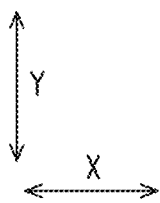
FIG. 5A

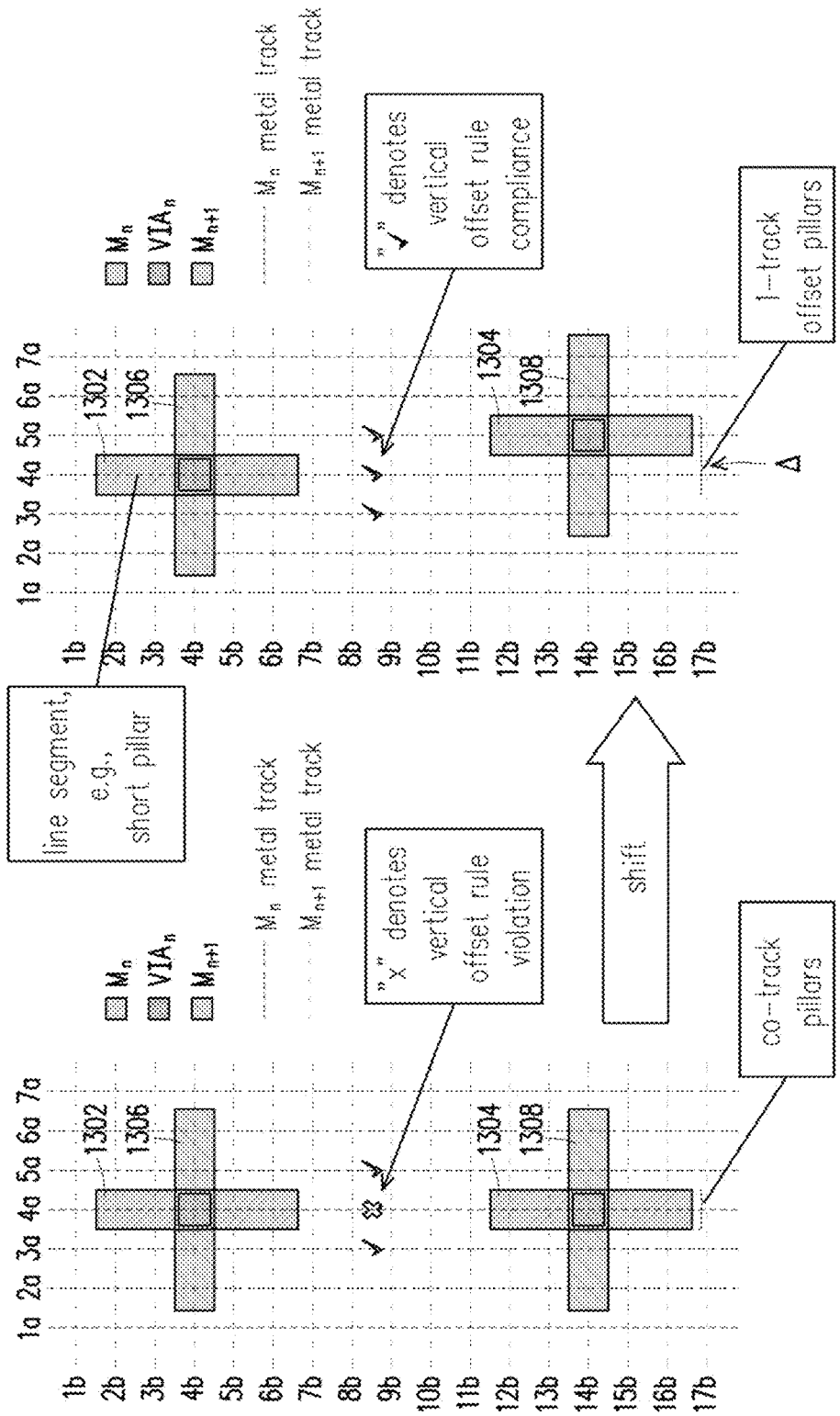

METHOD OF FORMING POWER GRID STRUCTURES

PRIORITY CLAIM AND CROSS-REFERENCE

This application is a divisional application of U.S. patent application Ser. No. 15/729,281 filed Oct. 10, 2017, now U.S. Pat. No. 11,251,124, issued Feb. 15, 2022, that claims priority to U.S. provisional patent application No. 62/427,630 filed on Nov. 29, 2016, each of which is incorporated herein by reference in their entireties.

BACKGROUND

In many integrated circuits (ICs), power rails are used to distribute power to functional circuit elements formed in a substrate. Power is often delivered to power rails using metal layers between the power rails and power straps at a level above the level of the power rails.

The resistance of an IC structure including such metal layers can affect the efficiency of power delivery, heat generation, and susceptibility to electromigration (EM). Routing of the metal layers can also impact the routing of additional electrical connections to the functional circuit elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, and 1C are diagrams of an IC structure, in accordance with some embodiments.

FIGS. 2A, 2B, and 2C are diagrams of an IC structure, in accordance with some embodiments.

FIGS. 5A and 5B are diagrams of an IC structure, in accordance with some embodiments.

FIGS. 13A-13B are layout diagrams of a portion of a shifted pillar of an IC structure, in accordance with at least one embodiment of the present disclosure.

Figure 1A:
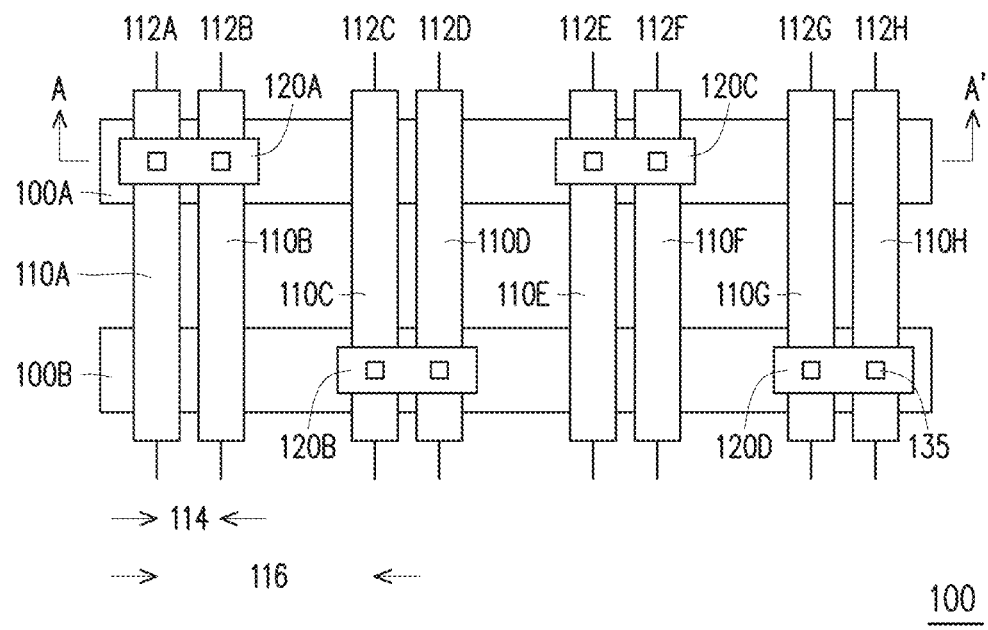

The patent or application file contains drawings/photographs executed in color. Copies of this patent with color drawing(s)/photograph(s) will be provided by the Office upon request and payment of the necessary fee.

DETAILED DESCRIPTION

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An IC structure includes a power rail and first metal segments above the power rail. The first metal segments are oriented in a first metal level direction perpendicular to a power rail direction and first vias are positioned between the power rail and the first metal segments at locations where first metal segments overlap the power rail. A second metal segment is positioned above the first metal segments, overlaps the power rail, and is oriented in the power rail direction. Second vias are positioned above the first vias between the first metal segments and the second metal segments. A power strap is positioned above the second metal segment and is electrically connected to the power rail by the first and second metal segments and the first and second vias. Each first metal segment of the plurality of first metal segments has a minimum width, and the power strap has a width greater than a minimum width. In some embodiments, a second power strap is electrically connected to a second power rail.

Figure 1C:
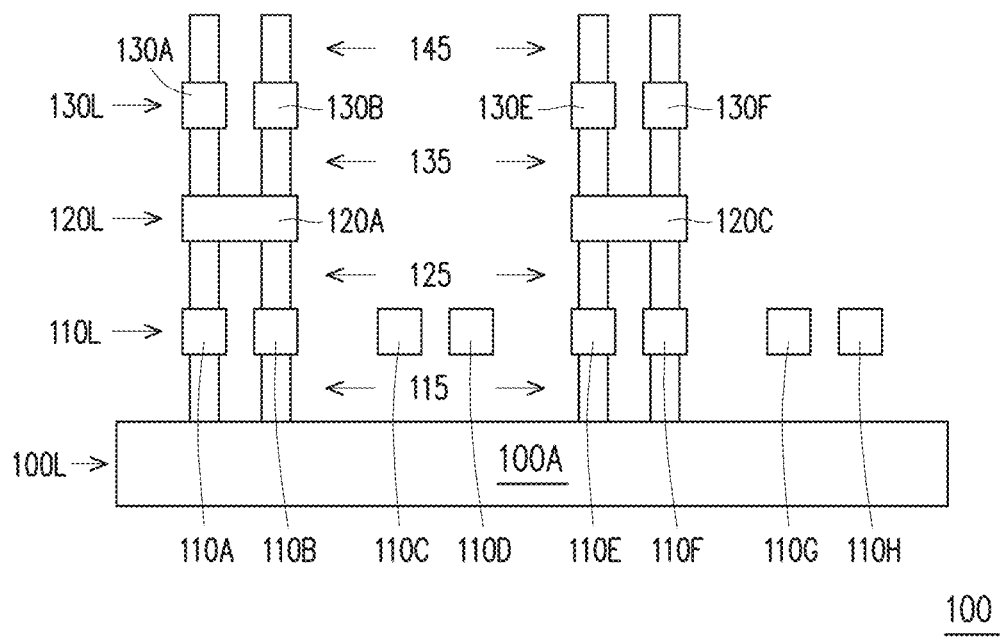

FIGS. 1A, 1B, and 1C are diagrams of an IC structure 100, in accordance with some embodiments. FIG. 1A is a diagram based on a top view of a lower portion of IC structure 100, FIG. 1B is a diagram based on a top view of an upper portion of IC structure 100, and FIG. 1C is a diagram based on a cross-sectional view of IC structure 100 as intersected by plane A-A'.

As shown in FIG. 1A, IC structure 100 includes power rails 100A and 100B, first metal segments 110A, 110B, 110C, 110D, 110E, 110F, 110G, and 110H, and second metal segments 120A, 120B, 120C, and 120D. A first direction X and a second direction Y, perpendicular to first direction X, are indicated in FIG. 1A. As shown in FIG. 1B, IC structure 100 also includes third metal segments 130A, 130B, 130C, 130D, 130E, 130F, 130G, and 130H. For simplicity, the first metal segments 110A-110H are omitted in FIG. 1B.

As shown in FIG. 1C (in part), power rails 100A and 100B are positioned at a power rail level 100L, first metal segments 110A, 110B, 110C, 110D, 110E, 110F, 110G, and 110H are positioned at a first metal level 110L above power rail level 100L, second metal segments 120A, 120B, 120C, and 120D are positioned at a second metal level 120L above first metal level 110L, and third metal segments 130A, 130B, 130C, 130D, 130E, 130F, 130G, and 130H are positioned at a third metal level 130L above second metal level 120L.

In some embodiments, first metal level 110L is immediately above power rail level 100L. In some embodiments, one or more metal levels (not shown) separate first metal level 110L from power rail level 100L and first metal level 110L is not immediately above power rail level 100L.

In some embodiments, second metal level 120L is immediately above first metal level 110L. In some embodiments, one or more metal levels (not shown) separate second metal level 120L from first metal level 110L and second metal level 120L is not immediately above first metal level 110L.

In some embodiments, third metal level 130L is immediately above second metal level 120L. In some embodiments, one or more metal levels (not shown) separate third metal level 130L from second metal level 120L and third metal level 130L is not immediately above second metal level 120L.

In some embodiments, power rail level 100L is a metal zero layer of an IC process, first metal level 110L is a metal one layer of the IC process, second metal level 120L is a metal two layer of the IC process, and third metal level 130L is a metal three layer of the IC process.

Each of power rails 100A and 100B, first metal segments 110A, 110B, 110C, 110D, 110E, 110F, 110G, and 110H, second metal segments 120A, 120B, 120C, and 120D, and third metal segments 130A, 130B, 130C, 130D, 130E, 130F, 130G, and 130H comprises a conductive material such as a metal, a metal composite, or other suitable material that is formed in one or more metallization layers by one or more of a physical vapor deposition process, a chemical vapor deposition process, a plating process, or other suitable process.

Power rails 100A and 100B are electrically conductive line segments positioned in parallel at power rail level 100L and oriented in first direction X. First direction X is also described as a power rail direction. In some embodiments, IC structure 100 includes only one of power rails 100A or 100B.

In some embodiments, power rails 100A and 100B are configured as outbound power rails for VDD and VSS of one or more functional circuit elements (not shown) positioned at and/or below power rail level 100L. In some embodiments, one or more functional circuit elements are configured as cells (not shown) positioned between power rails 100A and 100B. The one or more functional circuit elements include a transistor, diode, resistor, inductor, capacitor, or other suitable device, or a combination of one or more such devices formed in a substrate.

First metal segments 110A, 110B, 110C, 110D, 110E, 110F, 110G, and 110H are electrically conductive line segments positioned in parallel at first metal level 110L and oriented in second direction Y. Second direction Y is also described as a first metal level direction.

Each of first metal segments 110A, 110B, 110C, 110D, 110E, 110F, 110G, and 110H overlaps both power rail 100A and power rail 100B and is also described as a metal strap. First metal segments 110A, 110B, 110C, 110D, 110E, 110F, 110G, and 110H are also described as a plurality of first metal segments or a plurality of metal straps. In some embodiments, first metal level 110L corresponds to a metal strap level. In some embodiment, second direction Y corresponds to a metal strap direction.

In the embodiment shown in FIGS. 1A, 1B, and 1C, a plurality of first metal segments includes eight first metal segments. In some embodiments, a plurality of first metal segments includes first metal segments (not shown) in addition to first metal segments 110A, 110B, 110C, 110D, 110E, 110F, 110G and 110H. In some embodiments, a plurality of first metal segments includes a subset of first metal segments 110A, 110B, 110C, 110D, 110E, 110F, 110G and 110H.

In some embodiments, each first metal segment of a plurality of first metal segments has a width corresponding to a predetermined minimum width for first metal level 110L. In some embodiments, each first metal segment of a plurality of first metal segments has a width corresponding to a predetermined minimum width for a metal one layer of an IC process. Because of process variations, a width corresponding to a predetermined minimum width has a value within a tolerance range about the predetermined minimum width.

First metal segments 110A, 110B, 110C, 110D, 110E, 110F, 110G, and 110H are positioned along tracks 112A, 112B, 112C, 112D, 112E, 112F, 112G, and 112H, respectively. First metal segments 110A and 110B are a pair of first metal segments having a pitch 114 defined as the distance between tracks 112A and 112B. Similarly, first metal segments 110C and 110D, 110E and 110F, and 110G and 110H are pairs of first metal segments having pitch 114 (not labelled). The spacing of pairs of first metal segments is shown in FIG. 1A as pitch 116, the distance between tracks 112A and 112C.

In some embodiments, pitch 114 corresponds to a poly pitch of an IC process. In some embodiments, pitch 114 corresponds to a metal one pitch of an IC process that is the same as a poly pitch of the IC process. In some embodiments, pitch 114 corresponds to a metal one pitch of an IC process that is different from a poly pitch of the IC process. In some embodiments, pitch 114 corresponds to a multiple of a metal one pitch of an IC process.

In some embodiments, pitch 116 is a multiple of pitch 114. In some embodiments, pitch 116 is a multiple of pitch 114 that ranges from eight to 64. In some embodiments, pitch 116 is a multiple of pitch 114 that equals 16. In some embodiments, pitch 114 and pitch 116 are both multiples of a metal one pitch of an IC process.

First vias 115 are vias positioned between power rail level 100L and first metal level 110L at locations at which first metal segments 110A, 110B, 110E, and 110F overlap power rail 100A and at locations at which first metal segments 110C, 110D, 110G, and 110H overlap first power rail 100B. In some embodiments, first vias 115 are single vias positioned at the locations at which metal segments 110C, 110D, 110G, and 110H overlap first power rail 100B. First vias 115 are not positioned at locations at which first metal segments 110A, 110B, 110E, and 110F overlap power rail 100B or at locations at which metal segments 110C, 110D, 110G, and 110H overlap first power rail 100A.

By this configuration, first vias 115 electrically connect first metal segments 110A, 110B, 110E, and 110F to power rail 100A and are free from electrically connecting first metal segments 110A, 110B, 110E, and 110F to power rail 100B. By this configuration, first vias 115 also electrically connect first metal segments 110C, 110D, 110G, and 110H to power rail 100B and are free from electrically connecting first metal segments 110C, 110D, 110G, and 110H to power rail 100A.

In accordance with this configuration, first metal segments 110A, 110B 110E, and 110F are described as a first set of pairs of first metal segments, and first metal segments 110C, 110D 110G, and 110H are described as a second set of pairs of first metal segments. In the embodiment shown in FIGS. 1A, 1B, and 1C, a set of pairs of first metal segments includes two pairs of first metal segments. In some embodiments, a set of pairs of first metal segments includes pairs of first metal segments (not shown) in addition to first metal segments 110A, 110B, 110C, 110D, 110E, 110F, 110G, and 110H.

Second metal segments 120A, 120B, 120C, and 120D are electrically conductive line segments oriented in first direction X. Second metal segment 120A overlaps power rail 100A at the locations at which first metal segments 110A and 110B overlap power rail 100A, and second metal segment 120C overlaps power rail 100A at the locations at which first metal segments 110E and 110F overlap power rail 100A. Second metal segment 120B overlaps power rail 100B at the locations at which first metal segments 110C and 110D overlap power rail 100B, and second metal segment 120D overlaps power rail 100B at the locations at which first metal segments 110G and 110H overlap power rail 100B.

Each of second metal segments 120A and 120C is free from overlapping first metal segments 110C, 110D, 110G, or 110H, and each of second metal segments 120B and 120D is free from overlapping first metal segments 110A, 110B, 110E, or 110F.

Second metal segments 120A, 120B, 120C, and 120D are also described as a plurality of second metal segments. In the embodiment shown in FIGS. 1A, 1B, and 1C, a plurality of second metal segments includes four second metal segments. In some embodiments, a plurality of second metal segments includes second metal segments (not shown) in addition to second metal segments 120A, 120B, 120C, and 120D. In some embodiments, a plurality of second metal segments includes a subset of second metal segments 120A, 120B, 120C, and 120D.

In some embodiments, each second metal segment of a plurality of second metal segments has a width corresponding to a predetermined minimum width for second metal level 120L. In some embodiments, each second metal segment of a plurality of second metal segments has a width corresponding to a predetermined minimum width for a metal two layer of an IC process.

Second vias 125 are vias positioned between first metal level 110L and second metal level 120L at locations above the locations at which first vias 115 are positioned. Thus, second vias 125 are positioned at the locations at which second metal segment 120A overlaps first metal segments 110A and 110B, the locations at which second metal segment 120B overlaps first metal segments 110C and 110D, the locations at which second metal segment 120C overlaps first metal segments 110E, and the locations at which second metal segment 120D overlaps first metal segments 110G and 110H. In some embodiments, second vias 125 are single vias positioned at the locations above the locations at which first vias 115 are positioned.

By this configuration, second metal segment 120A is electrically connected to first metal segments 110A and 110B, second metal segment 120B is electrically connected to first metal segments 110C and 110D, second metal segment 120C is electrically connected to first metal segments 110E and 110F, and second metal segment 120D is electrically connected to first metal segments 110G and 110H.

Third metal segments 130A, 130B, 130C, 130D, 130E, 130F, 130G, and 130H are electrically conductive line segments positioned in parallel at third metal level 130L and oriented in second direction Y.

Each of third metal segments 130A, 130B, 130C, 130D, 130E, 130F, 130G, and 130H overlaps only one of power rail 100A or power rail 100B and is also described as a metal stub. In some embodiments, third metal level 130L corresponds to a metal stub level.

Third metal segments 130A and 130B overlap second metal segment 120A and power rail 100A. Third metal segments 130C and 130D overlap second metal segment 120B and power rail 100B. Third metal segments 130E and 130F overlap second metal segment 120C and power rail 100A. Third metal segments 130G and 130H overlap second metal segment 120D and power rail 100B.

Third metal segments 130A, 130B, 130C, 130D, 130E, 130F, 130G, and 130H are also described as a plurality of third metal segments or a plurality of metal stubs. In the embodiment shown in FIGS. 1A, 1B, and 1C, a plurality of third metal segments includes eight third metal segments. In some embodiments, a plurality of third metal segments includes third metal segments (not shown) in addition to third metal segments 130A, 130B, 130C, 130D, 130E, 130F, 130G, and 130H. In some embodiments, a plurality of third metal segments includes a subset of third metal segments 130A, 130B, 130C, 130D, 130E, 130F, 130G, and 130H.

Third metal segments 130A, 130B, 130C, 130D, 130E, 130F, 130G, and 130H are positioned along tracks 132A, 132B, 132C, 132D, 132E, 132F, 132G, and 132H, respectively. In some embodiments, tracks 132A, 132B, 132C, 132D, 132E, 132F, 132G, and 132H align with tracks 112A, 112B, 112C, 112D, 112E, 112F, 112G, and 112H, respectively. In some embodiments, each track of tracks 132A, 132B, 132C, 132D, 132E, 132F, 132G, and 132H does not align with a corresponding track of tracks 112A, 112B, 112C, 112D, 112E, 112F, 112G, and 112H, but is sufficiently close to a corresponding track so that a corresponding third metal segment of third metal segments 130A, 130B, 130C, 130D, 130E, 130F, 130G, and 130H overlaps a corresponding first metal segment of first metal segments 110A, 110B, 110C, 110D, 110E, 110F, 110G, and 110H.

In some embodiments, each third metal segment of a plurality of third metal segments has a width corresponding to a predetermined minimum width for third metal level 130L. In some embodiments, each third metal segment of a plurality of third metal segments has a width corresponding to a predetermined minimum width for a metal three layer of an IC process.

Third vias 135 are vias positioned between second metal level 120L and third metal level 130L at locations above the locations at which second vias 125 are positioned. Thus, third vias are positioned at the locations at which third metal segments 130A and 130B overlap second metal segment 120A, the locations at which third metal segments 130C and 130D overlap second metal segment 120B, the locations at which third metal segments 130E and 130F overlap second metal segment 120C, and the locations at which third metal segments 130G and 130H overlap second metal segment 120D. In some embodiments, third vias 135 are single vias positioned at the locations above the locations at which second vias 125 are positioned. Third vias 135 are shown in FIG. 1A, with one third via 135 labelled as an example.

By this configuration, third metal segments 130A and 130B are electrically connected to second metal segment 120A, third metal segments 130C and 130D are electrically connected to second metal segment 120B, third metal segments 130E and 130F are electrically connected to second metal segment 120C, and third metal segments 130G and 130H are electrically connected to second metal segment 120D.

Fourth vias 145 are vias positioned above third metal level 130L at locations above the locations at which third vias 135 are positioned. As discussed below with respect to IC structure 500, by this configuration, third metal segments 130A and 130B are electrically connected to a fourth metal segment 540A, third metal segments 130C and 130D are electrically connected to a fourth metal segment 540B, third metal segments 130E and 130F are electrically connected to a fourth metal segment 540C, and third metal segments 130G and 130H are electrically connected to a fourth metal segment 540D. In some embodiments, fourth vias 145 are single vias positioned at the locations above the locations at which third vias 135 are positioned. Fourth vias 145 are shown in FIG. 1B, with one fourth via 145 labelled as an example.

The configuration of IC structure 100 in combination with IC structure 500 thereby establishes electrical connections between power straps positioned at upper metal layers and power rails at lower layers using minimum-width metal elements and, in some embodiments, single vias in the layers between the power straps and the power rails. By providing parallel paths having low resistance, one or more embodiments enable efficient power delivery, limited heat generation, and low susceptibility to EM.

In at least some embodiments, the double strap and extended pitch configuration of the sets of pairs of first metal segments also facilitates routing of various electrical connections to functional circuits powered via the power rails, e.g., by reducing an area/footprint impact of the power-grid (which increases space available for placement of other structure).

Compared to approaches that use metal elements wider than minimum-width metal elements and/or multiple vias at locations where metal elements overlap, one or more embodiments thereby provide power distribution to functional circuit elements with less impact on routing of other connections to those functional circuit elements.

Figure 2B:
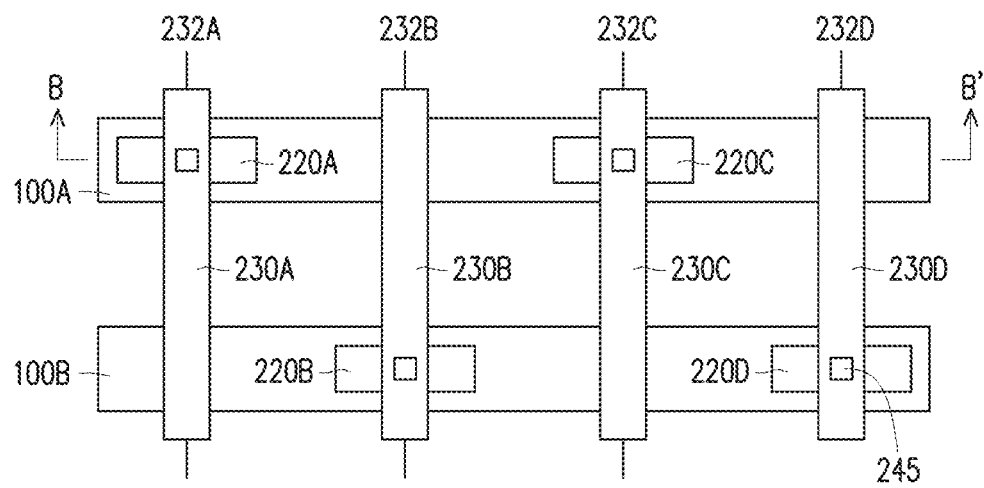
Figure 2C:
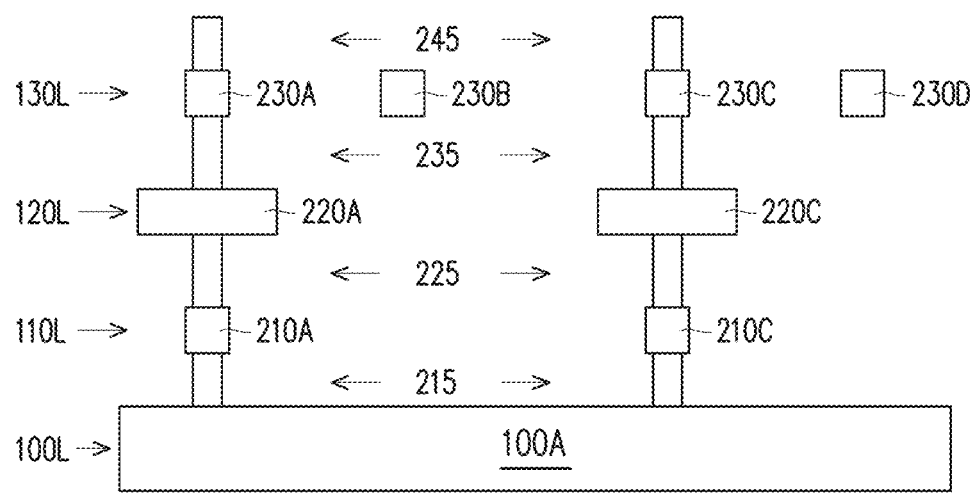

FIGS. 2A, 2B, and 2C are diagrams of an IC structure 200, in accordance with some embodiments. FIG. 2A is a diagram based on a top view of a lower portion of IC structure 200, FIG. 2B is a diagram based on a top view of an upper portion of IC structure 200, and FIG. 2C is a diagram based on a cross-sectional view of IC structure 200 as intersected by plane B-B'. Metallization levels shown in IC structure 200 include power rail level 100L (at which power rails 100A and 100B are located), first metal level 110L, second metal level 120L, and third metal level 130L, described above with respect to IC structure 100 and FIGS. 1A, 1B, and 1C. First direction X and second direction Y, described above with respect to IC structure 100 and FIG. 1A, are indicated in FIG. 2A.

In addition to the elements of IC structure 100, IC structure 200 includes first metal segments 210A, 210B, 210C, and 210D positioned at first level 110L, second metal segments 220A, 220B, 220C, and 220D positioned at second metal level 120L, and third metal segments 230A, 230B, 230C, and 230D positioned at third metal level 130L.

Each of first metal segments 210A, 210B, 210C, and 210D, second metal segments 220A, 220B, 220C, and 220D, and third metal segments 230A, 230B, 230C, and 230D comprises a conductive material such as a metal, a metal composite, or other suitable material that is formed in one or more metallization layers by one or more of a physical vapor deposition process, a chemical vapor deposition process, a plating process, or other suitable process.

First metal segments 210A, 210B, 210C, and 210D are electrically conductive line segments positioned in parallel at first metal level 110L and oriented in second direction Y. First metal segments 210A and 210C overlap power rail 100A, and first metal segments 210B and 210D overlap power rail 100B. Each of first metal segments 210A, 210B, 210C, and 210D therefore overlaps only one of power rail 100A or power rail 100B and is also described as a metal stub. In some embodiments, first metal level 110L corresponds to a metal stub level.

First metal segments 210A, 210B, 210C, and 210D are also described as a plurality of first metal segments or a plurality of metal stubs. In the embodiment shown in FIGS. 2A, 2B, and 2C, a plurality of first metal segments includes four first metal segments. In some embodiments, a plurality of first metal segments includes first metal segments (not shown) in addition to first metal segments 210A, 210B, 210C, and 210D. In some embodiments, a plurality of first metal segments includes a subset of first metal segments 210A, 210B, 210C, and 210D.

In some embodiments, each first metal segment of a plurality of first metal segments has a width corresponding to a predetermined minimum width for first metal level 110L. In some embodiments, each first metal segment of a plurality of first metal segments has a width corresponding to a predetermined minimum width for a metal one layer of an IC process.

First metal segments 210A, 210B, 210C, and 210D are positioned along tracks 212A, 212B, 212C, and 212D, respectively. The spacing of first metal segments 210A, 210B, 210C, and 210D is shown in FIG. 2A as pitch 216, the distance between tracks 212A and 212B. In some embodiments, pitch 216 is a multiple of a metal one pitch of an IC process that is the same as a poly pitch of the IC process. In some embodiments, pitch 216 is a multiple of a metal one pitch of an IC process that is different from a poly pitch of the IC process. In some embodiments, pitch 216 is a multiple of a metal one pitch of an IC process that ranges from four to 16. In some embodiments, pitch 216 is a multiple of a metal one pitch of an IC process that equals eight.

First vias 215 are vias positioned between power rail level 100L and first metal level 110L at locations at which first metal segments 210A and 210C overlap power rail 100A, and at locations at which metal segments 210B and 210D overlap first power rail 100B. In some embodiments, first vias 215 are single vias positioned at the locations at which first metal segments 210A and 210C overlap power rail 100A, and the locations at which first metal segments 210B and 210D overlap first power rail 100B. By this configuration, first vias 215 electrically connect first metal segments 210A and 210C to power rail 100A and electrically connect first metal segments 210B and 210D to power rail 100B.

Second metal segments 220A, 220B, 220C, and 220D are electrically conductive line segments oriented in first direction X. Second metal segment 220A overlaps power rail 100A at the location at which first metal segment 210A overlaps power rail 100A, second metal segment 120B overlaps power rail 100B at the location at which first metal segment 210B overlaps power rail 100B, second metal segment 120C overlaps power rail 100A at the location at which first metal segment 210C overlaps power rail 100A, and second metal segment 220D overlaps power rail 100B at the location at which first metal segment 210D overlaps power rail 100B.

Second metal segments 220A, 220B, 220C, and 220D are also described as a plurality of second metal segments. In the embodiment shown in FIGS. 2A, 2B, and 2C, a plurality of second metal segments includes four second metal segments. In some embodiments, a plurality of second metal segments includes second metal segments (not shown) in addition to second metal segments 220A, 220B, 220C, and 220D. In some embodiments, a plurality of second metal segments includes a subset of second metal segments 220A, 220B, 220C, and 220D.

In some embodiments, each second metal segment of a plurality of second metal segments has a width corresponding to a predetermined minimum width for second metal level 120L. In some embodiments, each second metal segment of a plurality of second metal segments has a width corresponding to a predetermined minimum width for a metal two layer of an IC process.

Second vias 225 are vias positioned between first metal level 110L and second metal level 120L at locations above the locations at which first vias 215 are positioned. Thus, second vias 225 are positioned at the locations at which second metal segment 220A overlaps first metal segment 210A, second metal segment 220B overlaps first metal segment 210B, second metal segment 220C overlaps first metal segment 210C, and second metal segment 220D overlaps first metal segment 210D. In some embodiments, second vias 225 are single vias positioned at the locations above the locations at which first vias 215 are positioned.

By this configuration, second metal segment 220A is electrically connected to first metal segment 210A, second metal segment 220B is electrically connected to first metal segment 210B, second metal segment 220C is electrically connected to first metal segment 210C, and second metal segment 220D is electrically connected to first metal segment 210D.

Third metal segments 230A, 230B, 230C, and 230D are electrically conductive line segments positioned in parallel at third metal level 130L and oriented in second direction Y. Each of third metal segments 230A, 230B, 230C, and 230D overlaps both power rail 100A and power rail 100B and is also described as a metal strap. Third metal segments 230A, 230B, 230C, and 230D are also described as a plurality of third metal segments or a plurality of metal straps. In some embodiments, third metal level 130L corresponds to a metal strap level.

Third metal segment 230A overlaps second metal segment 220A and power rail 100A. Third metal segment 230B overlaps second metal segment 220B and power rail 100B. Third metal segment 230C overlaps second metal segment 220C and power rail 100A. Third metal segment 230D overlaps second metal segment 220D and power rail 100B.

In the embodiment shown in FIGS. 2A, 2B, and 2C, a plurality of third metal segments includes four third metal segments. In some embodiments, a plurality of third metal segments includes third metal segments (not shown) in addition to third metal segments 230A, 230B, 230C, and 230D. In some embodiments, a plurality of third metal segments includes a subset of third metal segments 230A, 230B, 230C, and 230D.

Third metal segments 230A, 230B, 230C, and 230D are positioned along tracks 232A, 232B, 232C, and 232D, respectively. In some embodiments, tracks 232A, 232B, 232C, and 232D align with tracks 212A, 212B, 212C, and 212D, respectively. In some embodiments, each track of tracks 232A, 232B, 232C, and 232D does not align with a corresponding track of tracks 212A, 212B, 212C, and 212D, but is sufficiently close to a corresponding track so that a corresponding third metal segment of third metal segments 230A, 230B, 230C, and 230D overlaps a corresponding first metal segment of first metal segments 210A, 210B, 210C, and 210D.

In some embodiments, each third metal segment of a plurality of third metal segments has a width corresponding to a predetermined minimum width for third metal level 130L. In some embodiments, each third metal segment of a plurality of third metal segments has a width corresponding to a predetermined minimum width for a metal three layer of an IC process.

Third vias 235 are vias positioned between second metal level 120L and third metal level 130L at locations above the locations at which second vias 225 are positioned. Thus, third vias are positioned at the locations at which third metal segment 230A overlaps second metal segment 220A, third metal segment 230B overlaps second metal segment 220B, third metal segment 230C overlaps second metal segment 220C, and third metal segment 230D overlaps second metal segment 220D. In some embodiments, third vias 235 are single vias positioned at the locations above the locations at which second vias 225 are positioned. Third vias 235 are shown in FIG. 2A, with one third via 235 labelled as an example.

By this configuration, third metal segment 230A is electrically connected to second metal segment 220A, third metal segment 230B is electrically connected to second metal segment 220B, third metal segment 230C is electrically connected to second metal segment 220C, and third metal segment 230D is electrically connected to second metal segment 220D.

In accordance with this configuration, third metal segments 230A and 230C are described as a first set of third metal segments, and third metal segments 230B and 230D are described as a second set of third metal segments. In the embodiment shown in FIGS. 2A, 2B, and 2C, a set of third metal segments includes two third metal segments. In some embodiments, a set of third metal segments includes third metal segments (not shown) in addition to third metal segments 230A, 230B, 230C, and 230D.

Fourth vias 245 are vias positioned above third metal level 130L at locations above the locations at which third vias 235 are positioned. As discussed below with respect to IC structure 500, by this configuration, third metal segment 230A is electrically connected to a fourth metal segment 540A, third metal segment 230B is electrically connected to a fourth metal segment 540B, third metal segment 230C is electrically connected to a fourth metal segment 540C, and third metal segment 230D is electrically connected to a fourth metal segment 540D. In some embodiments, fourth vias 245 are single vias positioned at the locations above the locations at which third vias 235 are positioned. Fourth vias 245 are shown in FIG. 2B, with one fourth via 245 labelled as an example.

The configuration of IC structure 200 in combination with IC structure 500 thereby establishes electrical connections between power straps positioned at upper metal layers and power rails at lower layers using minimum-width metal elements and, in some embodiments, single vias in the layers between the power straps and the power rails. By providing parallel paths having low resistance, one or more embodiments enable efficient power delivery, limited heat generation, and low susceptibility to EM.

In at least some embodiments, alternating strap and extended pitch configuration of the sets of third metal segments also facilitates routing of various electrical connections to functional circuits powered via the power rails.

Compared to approaches that use metal elements wider than minimum-width metal elements and/or multiple vias at locations where metal elements overlap, one or more embodiments thereby provide power distribution to functional circuit elements with less impact on routing of other connections to those functional circuit elements.

Figure 3A:
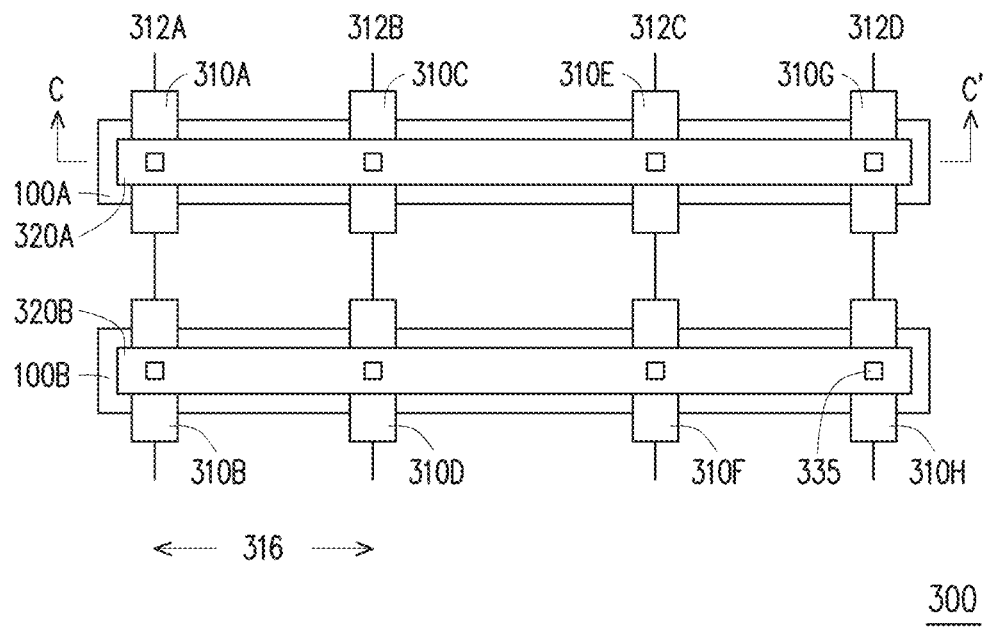
FIGS. 3A, 3B, and 3C are diagrams of an IC structure, in accordance with some embodiments.
Figure 3B:
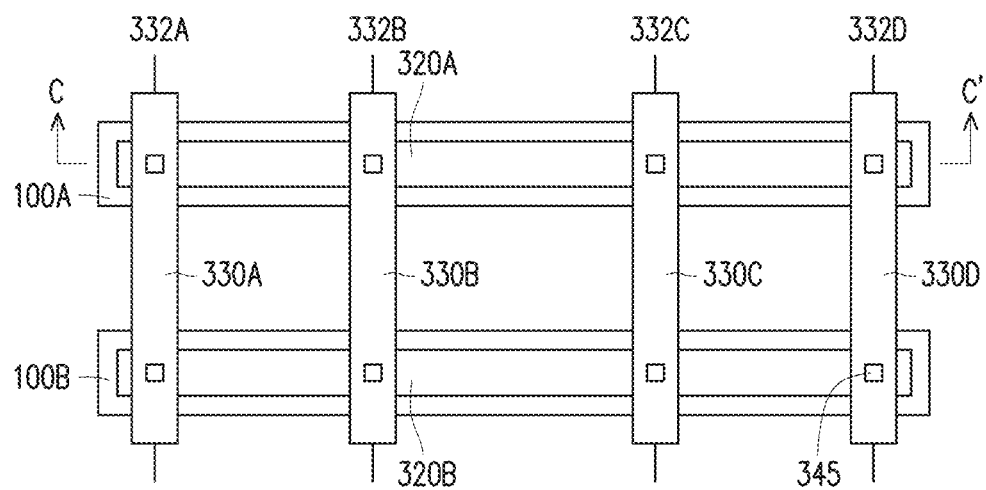
Figure 3C:
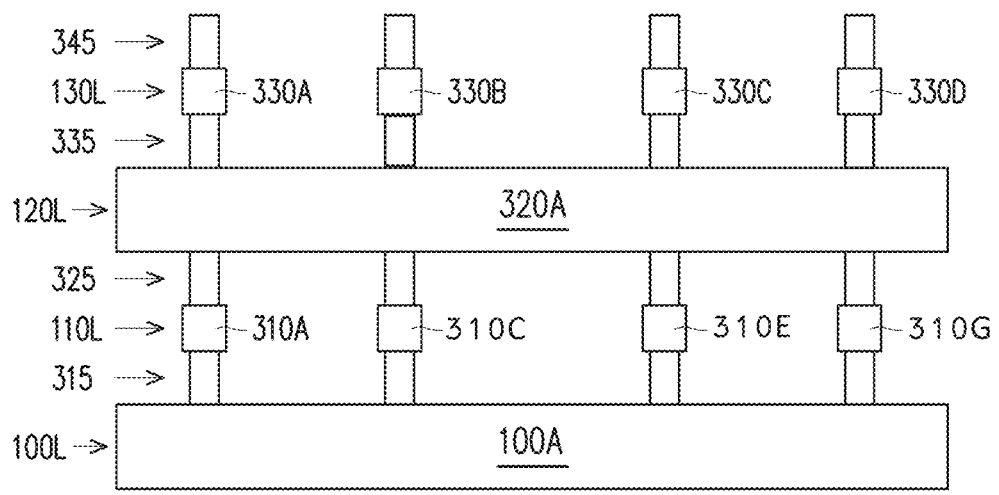

FIGS. 3A, 3B, and 3C are diagrams of an IC structure 300, in accordance with some embodiments. FIG. 3A is a diagram based on a top view of a lower portion of IC structure 300, FIG. 3B is a diagram based on a top view of an upper portion of IC structure 300, and FIG. 3C is a diagram based on a cross-sectional view of IC structure 300 as intersected by plane C-C'. Metallization levels shown in IC structure 300 include power rail level 100L (at which are located power rails 100A and 100B), first metal level 110L, second metal level 120L, and third metal level 130L, described above with respect to IC structure 100 and FIGS. 1A, 1B, and 1C. First direction X and second direction Y, described above with respect to IC structure 100 and FIG. 1A, are indicated in FIG. 3A.

In addition to the elements of IC structure 100, IC structure 300 includes first metal segments 310A, 310B, 310C, 310D, 310E, 310F, 310G, and 310H positioned at first level 110L, second metal segments 320A and 320B positioned at second metal level 120L, and third metal segments 330A, 330B, 330C, and 330D positioned at third metal level 130L.

Each of first metal segments 310A, 310B, 310C, 310D, 310E, 310F, 310G, and 310H, second metal segments 320A and 320B, and third metal segments 330A, 330B, 330C, and 330D comprises a conductive material such as a metal, a metal composite, or other suitable material that is formed in one or more metallization layers by one or more of a physical vapor deposition process, a chemical vapor deposition process, a plating process, or other suitable process.

First metal segments 310A, 310B, 310C, 310D, 310E, 310F, 310G, and 310H are electrically conductive line segments positioned in parallel at first metal level 110L and oriented in second direction Y. First metal segments 310A, 310C, 310E, and 310G overlap power rail 100A, and first metal segments 310B, 310D, 310F, and 310H overlap power rail 100B. Each of first metal segments 310A, 310B, 310C, 310D, 310E, 310F, 310G, and 310H therefore overlaps only one of power rail 100A or power rail 100B and is also described as a metal stub. In some embodiments, first metal level 110L corresponds to a metal stub level.

First metal segments 310A, 310B, 310C, 310D, 310E, 310F, 310G, and 310H are also described as a plurality of first metal segments or a plurality of metal stubs. In the embodiment shown in FIGS. 3A, 3B, and 3C, a plurality of first metal segments includes eight first metal segments. In some embodiments, a plurality of first metal segments includes first metal segments (not shown) in addition to first metal segments 310A, 310B, 310C, 310D, 310E, 310F, 310G, and 310H. In some embodiments, a plurality of first metal segments includes a subset of first metal segments 310A, 310B, 310C, 310D, 310E, 310F, 310G, and 310H.

In some embodiments, each first metal segment of a plurality of first metal segments has a width corresponding to a predetermined minimum width for first metal level 110L. In some embodiments, each first metal segment of a plurality of first metal segments has a width corresponding to a predetermined minimum width for a metal one layer of an IC process.

First metal segments 310A and 310B are positioned along track 312A, first metal segments 310C and 310D are positioned along track 312B, first metal segments 310E and 310F are positioned along track 312C, and first metal segments 310G and 310H are positioned along track 312D. The spacing of first metal segments 310A, 310B, 310C, 310D, 310E, 310F, 310G, and 310H is shown in FIG. 3A as pitch 316, the distance between tracks 312A and 312B. In some embodiments, pitch 316 is a multiple of a metal one pitch of an IC process that is the same as a poly pitch of the IC process. In some embodiments, pitch 316 is a multiple of a metal one pitch of an IC process that is different from a poly pitch of the IC process. In some embodiments, pitch 316 is a multiple of a metal one pitch of an IC process that ranges from four to 16. In some embodiments, pitch 316 is a multiple of a metal one pitch of an IC process that equals eight. In some embodiments, pitch 316 is a multiple of a metal one pitch of an IC process that equals twelve.

First vias 315 are vias positioned between power rail level 100L and first metal level 110L at locations at which first metal segments 310A, 310C, 310E, and 310G overlap power rail 100A, and at locations at which metal segments 310B, 310D, 310F, and 310H overlap first power rail 100B. In some embodiments, first vias 315 are single vias positioned at the locations at which first metal segments 310A, 310C, 310E, and 310G overlap power rail 100A, and the locations at which first metal segments 310B, 310D, 310F, and 310H overlap first power rail 100B. By this configuration, first vias 315 electrically connect first metal segments 310A, 310C, 310E, and 310G to power rail 100A and electrically connect first metal segments 310B, 310D, 310F, and 310H to power rail 100B.

Second metal segments 320A and 320B are electrically conductive line segments oriented in first direction X. Second metal segment 320A overlaps power rail 100A at the locations at which first metal segments 310A, 310C, 310E, and 310G overlap power rail 100A, and second metal segment 320B overlaps power rail 100B at the locations at which first metal segments 310B, 310D, 310F, and 310H overlap power rail 100B. Second metal segments 320A and 320B are also described as a plurality of second metal segments.

In some embodiments, each second metal segment of a plurality of second metal segments has a width corresponding to a predetermined minimum width for second metal level 120L. In some embodiments, each second metal segment of a plurality of second metal segments has a width corresponding to a predetermined minimum width for a metal two layer of an IC process.

In some embodiments, each second metal segment of a plurality of second metal segments has a width greater than a predetermined minimum width for second metal level 120L. In some embodiments, each second metal segment of a plurality of second metal segments has a width corresponding to two times a predetermined minimum width for second metal level 120L.

In some embodiments, each second metal segment of a plurality of second metal segments has a width greater than a predetermined minimum width for a metal two layer of an IC process. In some embodiments, each second metal segment of a plurality of second metal segments has a width corresponding to two times a predetermined minimum width for a metal two layer of an IC process.

Second vias 325 are vias positioned between first metal level 110L and second metal level 120L at locations above the locations at which first vias 315 are positioned. Thus, second vias 325 are positioned at the locations at which second metal segment 320A overlaps first metal segments 310A, 310C, 310E, and 310G, and at the locations at which second metal segment 320B overlaps first metal segments 310B, 310D, 310F, and 310H. In some embodiments, second vias 325 are single vias positioned at the locations above the locations at which first vias 315 are positioned.

By this configuration, second metal segment 320A is electrically connected to first metal segments 310A, 310C, 310E, and 310G, and second metal segment 320B is electrically connected to first metal segments 310B, 310D, 310F, and 310H.

Third metal segments 330A, 330B, 330C, and 330D are electrically conductive line segments positioned in parallel at third metal level 130L and oriented in second direction Y.

Each of third metal segments 330A, 330B, 330C, and 330D overlaps both of power rails 100A and 100B, both of second metal segments 320A and 320B, and is also described as a metal strap. Third metal segments 330A, 330B, 330C, and 330D are also described as a plurality of third metal segments or a plurality of metal straps. In some embodiments, third metal level 130L corresponds to a metal strap level.

In the embodiment shown in FIGS. 3A, 3B, and 3C, a plurality of third metal segments includes four third metal segments. In some embodiments, a plurality of third metal segments includes third metal segments (not shown) in addition to third metal segments 330A, 330B, 330C, and 330D. In some embodiments, a plurality of third metal segments includes a subset of third metal segments 330A, 330B, 330C, and 330D.

Third metal segments 330A, 330B, 330C, and 330D are positioned along tracks 332A, 332B, 332C, and 332D, respectively. In some embodiments, tracks 332A, 332B, 332C, and 332D align with tracks 312A, 312B, 312C, and 312D, respectively. In some embodiments, each track of tracks 332A, 332B, 332C, and 332D does not align with a corresponding track of tracks 312A, 312B, 312C, and 312D, but is sufficiently close to a corresponding track so that a corresponding third metal segment of third metal segments 330A, 330B, 330C, and 330D overlaps a corresponding pair of first metal segments of first metal segments 310A, 310B, 310C, 310D, 310E, 310F, 310G, and 310H.

The location at which third metal segment 330A overlaps second metal segment 320A corresponds to the location at which second metal segment 320A overlaps first metal segment 310A, the location at which third metal segment 330B overlaps second metal segment 320B corresponds to the location at which second metal segment 320B overlaps first metal segment 310D, the location at which third metal segment 330C overlaps second metal segment 320A corresponds to the location at which second metal segment 320A overlaps first metal segment 310E, and the location at which third metal segment 330D overlaps second metal segment 320B corresponds to the location at which second metal segment 320B overlaps first metal segment 310F.

In some embodiments, each third metal segment of a plurality of third metal segments has a width corresponding to a predetermined minimum width for third metal level 130L. In some embodiments, each third metal segment of a plurality of third metal segments has a width corresponding to a predetermined minimum width for a metal three layer of an IC process.

Third vias 335 are vias positioned between second metal level 120L and third metal level 130L at locations above a subset of the locations at which second vias 325 are positioned. Accordingly, third vias are positioned at the locations at which third metal segment 330A overlaps second metal segment 320A, third metal segment 330B overlaps second metal segment 320B, third metal segment 330C overlaps second metal segment 320A, and third metal segment 330D overlaps second metal segment 320B. In some embodiments, third vias 335 are single vias positioned at the locations above a subset of the locations at which second vias 325 are positioned. Third vias 335 are shown in FIG. 3A, with one third via 335 labelled as an example.

By this configuration, third metal segments 330A and 330C are electrically connected to second metal segment 320A, and third metal segments 330B and 330D are electrically connected to second metal segment 320B.

In accordance with this configuration, third metal segments 330A and 330C are described as a first set of third metal segments, and third metal segments 330B and 330D are described as a second set of third metal segments. In the embodiment shown in FIGS. 3A, 3B, and 3C, a set of third metal segments includes two third metal segments. In some embodiments, a set of third metal segments includes third metal segments (not shown) in addition to third metal segments 330A, 330B, 330C, and 330D.

Fourth vias 345 are vias positioned above third metal level 130L at locations above the locations at which third vias 335 are positioned. As discussed below with respect to IC structure 500, by this configuration, third metal segment 330A is electrically connected to a fourth metal segment 540A, third metal segment 330B is electrically connected to a fourth metal segment 540B, third metal segment 330C is electrically connected to a fourth metal segment 540C, and third metal segment 330D is electrically connected to a fourth metal segment 540D. In some embodiments, fourth vias 345 are single vias positioned at the locations above the locations at which third vias 335 are positioned. Fourth vias 345 are shown in FIG. 3B, with one fourth via 345 labelled as an example.

The configuration of IC structure 300 in combination with IC structure 500 thereby establishes electrical connections between power straps positioned at upper metal layers and power rails at lower layers using minimum-width metal stubs and straps and, in some embodiments, single vias in the layers between the power straps and the power rails. By providing parallel paths having low resistance, particularly between power rails and second metal segments, one or more embodiments enable efficient power delivery, limited heat generation, and low susceptibility to EM.

In at least some embodiments, alternating strap and extended pitch configuration of the sets of third metal segments also facilitates routing of various electrical connections to functional circuits powered via the power rails.

Compared to approaches that use metal elements wider than minimum-width metal elements and/or multiple vias at locations where metal elements overlap, one or more embodiments thereby provide power distribution to functional circuit elements with less impact on routing of other connections to those functional circuit elements.

Figure 4A:
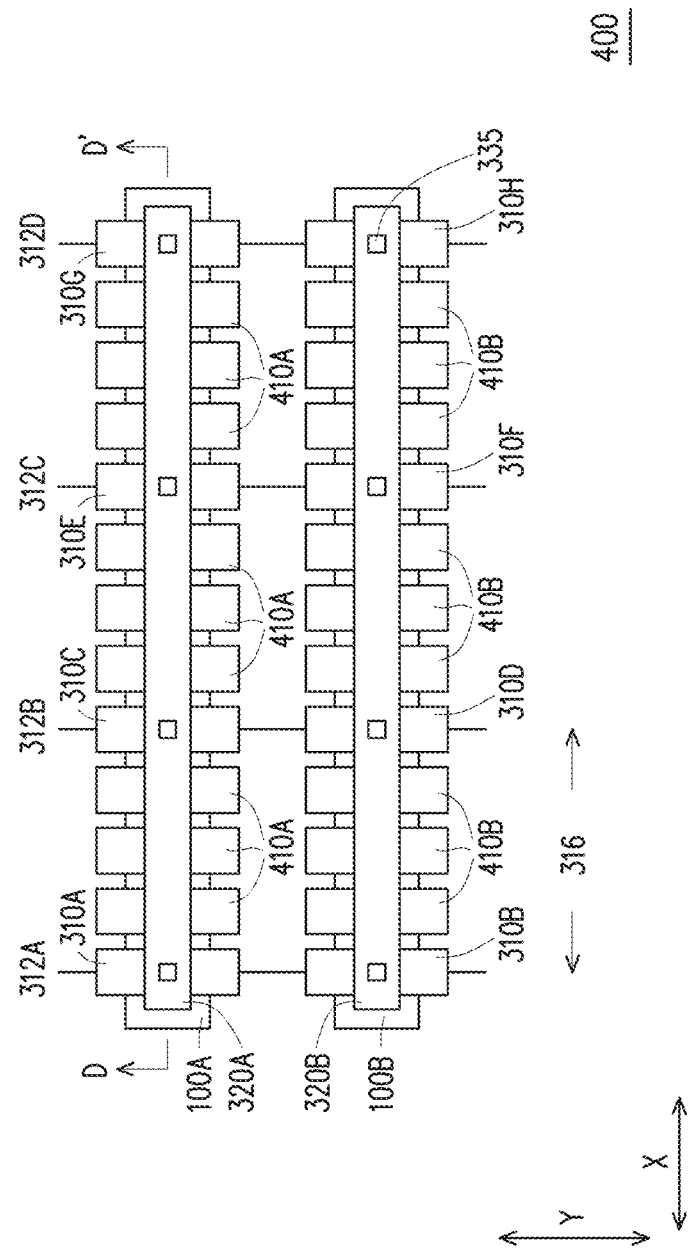
FIGS. 4A and 4B are diagrams of an IC structure, in accordance with some embodiments.
Figure 4B:
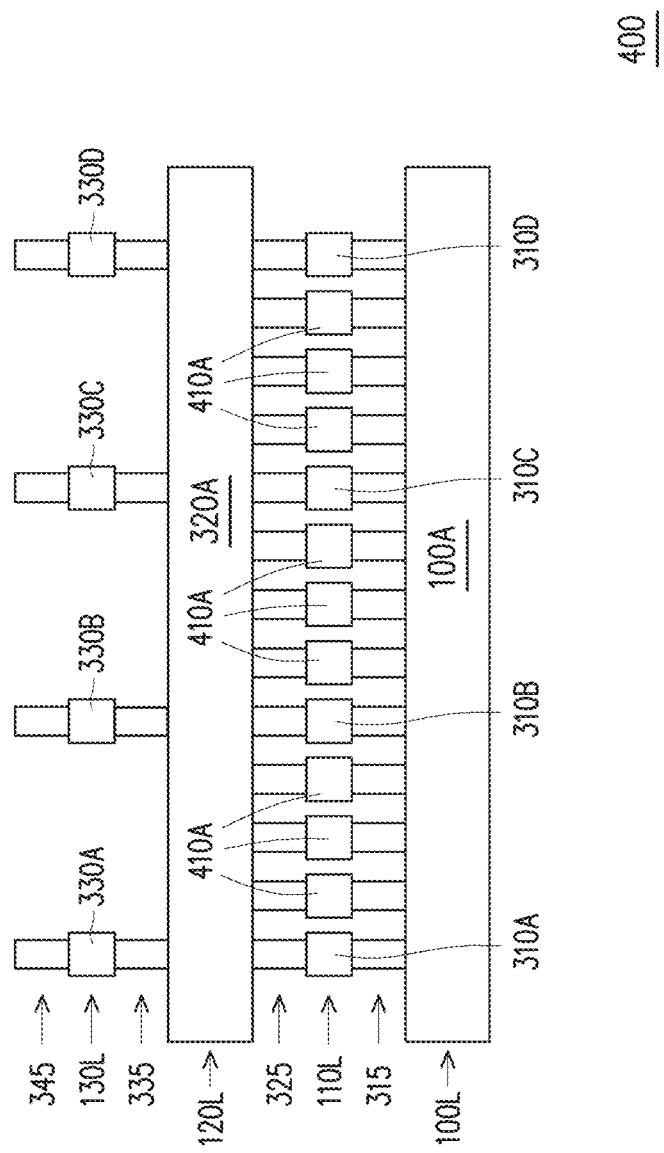

FIGS. 4A and 4B are diagrams of an IC structure 400, in accordance with some embodiments. FIG. 4A is a diagram based on a top view of a lower portion of IC structure 400 and FIG. 4B is a diagram based on a cross-sectional view of IC structure 400 as intersected by plane D-D'. IC structure 400 includes power rails 100A and 100B, power rail level 100L, first metal level 110L, second metal level 120L, and third metal level 130L, described above with respect to IC structure 100 and FIGS. 1A, 1B, and 1C. IC structure 400 also includes first metal segments 310A, 310B, 310C, 310D, 310E, 310F, 310G, and 310H, second metal segments 320A and 320B, and third metal segments 330A, 330B, 330C, and 330D, described above with respect to IC structure 300 and FIGS. 3A, 3B, and 3C. First direction X and second direction Y, described above with respect to IC structure 100 and FIG. 1A, are indicated in FIG. 4A.

In addition to the elements of IC structures 100 and 300, IC structure 400 includes first metal segments 410A and 410B positioned at first level 110L. Each of first metal segments 410A and 410B comprises a conductive material such as a metal, a metal composite, or other suitable material that is formed in one or more metallization layers by one or more of a physical vapor deposition process, a chemical vapor deposition process, a plating process, or other suitable process.

First metal segments 410A are electrically conductive line segments positioned at first metal level 110L in parallel with and between first metal segments 310A, 310C, 310E, and 310G. First metal segments 410A overlap power rail 100A and do not overlap power rail 100B.

First metal segments 410B are electrically conductive line segments positioned at first metal level 110L in parallel with and between first metal segments 310B, 310D, 310F, and 310H. First metal segments 410B overlap power rail 100B and do not overlap power rail 100A.

First metal segments 310A, 310B, 310C, 310D, 310E, 310F, 310G, 310H, 410A, and 410B are also described as a plurality of first metal segments or a plurality of metal stubs. In the embodiment shown in FIGS. 4A and 4B, a plurality of first metal segments includes three first metal segments 410A between each of two first metal segments 310A, 310C, 310E, and 310G, and three first metal segments 410B in between each of two first metal segments 310B, 310D, 310F, and 310H.

In some embodiments, a plurality of first metal segments includes fewer than three first metal segments 410A between each of two first metal segments 310A, 310C, 310E, and 310G. In some embodiments, a plurality of first metal segments includes greater than three first metal segments 410A between each of two first metal segments 310A, 310C, 310E, and 310G.

In some embodiments, a plurality of first metal segments includes fewer than three first metal segments 410B between each of two first metal segments 310B, 310D, 310F, and 310H. In some embodiments, a plurality of first metal segments includes greater than three first metal segments 410B between each of two first metal segments 310B, 310D, 310F, and 310H.

The locations at which third metal segments 330A and 330C overlap second metal segment 320A are a subset of the locations at which second metal segment 320A overlaps first metal segments 310A, 310C, 310E, 310G, and 410A, and the locations at which third metal segments 330B and 330D overlap second metal segment 320B are a subset of the locations at which second metal segment 320B overlaps first metal segments 310B, 310D, 310F, 310H, and 410B.

In some embodiments, each first metal segment of a plurality of first metal segments has a width corresponding to a predetermined minimum width for first metal level 110L. In some embodiments, each first metal segment of a plurality of first metal segments has a width corresponding to a predetermined minimum width for a metal one layer of an IC process.

First vias 315 are vias positioned between power rail level 100L and first metal level 110L at locations at which first metal segments 310A, 310C, 310E, 310G, and 410A overlap power rail 100A, and at locations at which metal segments 310B, 310D, 310F, 310H, and 410B overlap first power rail 100B. In some embodiments, first vias 315 are single vias positioned at the locations at which first metal segments 310A, 310C, 310E, 310G, and 410A overlap power rail 100A, and the locations at which metal segments 310B, 310D, 310F, 310H, and 410B overlap first power rail 100B. By this configuration, first vias 315 electrically connect first metal segments 310A, 310C, 310E, 310G, and 410A to power rail 100A and electrically connect first metal segments 310B, 310D, 310F, 310H, and 410B to power rail 100B.

Second vias 325 are vias positioned between first metal level 110L and second metal level 120L at locations above the locations at which first vias 315 are positioned. Thus, second vias 325 are positioned at the locations at which second metal segment 420A overlaps first metal segments 310A, 310C, 310E, 310G, and 410A, and at the locations at which second metal segment 420B overlaps first metal segments 310B, 310D, 310F, 310H, and 410B. In some embodiments, second vias 325 are single vias positioned at the locations above the locations at which first vias 315 are positioned.

By this configuration, second metal segment 420A is electrically connected to first metal segments 310A, 310C, 310E, 310G, and 410A, and second metal segment 420B is electrically connected to first metal segments 310B, 310D, 310F, 310H, and 410B.

The configuration of IC structure 400 in combination with IC structure 500 thereby establishes electrical connections between power straps positioned at upper metal layers and power rails at lower layers using minimum-width metal stubs and straps and, in some embodiments, single vias in the layers between the power straps and the power rails. By providing parallel paths having low resistance, particularly between power rails and second metal segments, one or more embodiments enable efficient power delivery, limited heat generation, and low susceptibility to EM.

In at least some embodiments, alternating strap and extended pitch configuration of the sets of third metal segments also facilitates routing of various electrical connections to functional circuits powered via the power rails.

Compared to approaches that use metal elements wider than minimum-width metal elements and/or multiple vias at locations where metal elements overlap, one or more embodiments thereby provide power distribution to functional circuit elements with less impact on routing of other connections to those functional circuit elements.

Figure 5B:
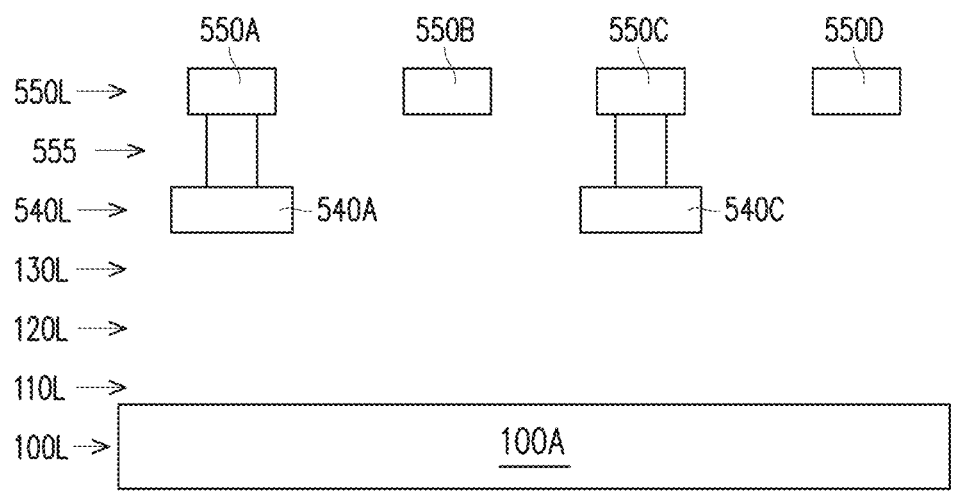

FIGS. 5A and 5B are diagrams of an IC structure 500, in accordance with some embodiments. FIG. 5A is a diagram based on a top view of IC structure 500, and FIG. 5B is a diagram based on a cross-sectional view of IC structure 500 as intersected by plane E-E'. IC structure 500 includes power rails 100A and 100B, power rail level 100L, first metal level 110L, second metal level 120L, and third metal level 130L, described above with respect to IC structure 100 and FIGS. 1A, 1B, and 1C. First direction X and second direction Y, described above with respect to IC structure 100 and FIG. 1A, are indicated in FIG. 5A.

In addition to the elements of IC structure 100, IC structure 500 includes fourth metal segments 540A, 540B, 540C, and 540D positioned at a fourth metal level 540L and power straps 550A, 550B, 550C, and 550D positioned at a power strap level 550L.

In some embodiments, fourth metal level 540L is immediately above third metal level 130L. In some embodiments, one or more metal levels (not shown) separate fourth metal level 540L from third metal level 130L and fourth metal level 540L is not immediately above third metal level 130L.

In some embodiments, power strap level 550L is immediately above fourth metal level 540L. In some embodiments, one or more metal levels (not shown) separate power strap level 550L from fourth metal level 540L and power strap level 550L is not immediately above fourth metal level 540L.

Each of fourth metal segments 540A, 540B, 540C, and 540D and power straps 550A, 550B, 550C, and 550D comprises a conductive material such as a metal, a metal composite, or other suitable material that is formed in one or more metallization layers by one or more of a physical vapor deposition process, a chemical vapor deposition process, a plating process, or other suitable process.

Fourth metal segments 540A, 540B, 540C, and 540D are electrically conductive line segments positioned in parallel at fourth metal level 540L and oriented in first direction X. Fourth metal segments 540A and 540C overlap power rail 100A, and fourth metal segments 540B and 540D overlap power rail 100B.

Fourth metal segments 540A, 540B, 540C, and 540D are also described as a plurality of fourth metal segments. In the embodiment shown in FIGS. 5A and 5B, a plurality of fourth metal segments includes four fourth metal segments. In some embodiments, a plurality of fourth metal segments includes fourth metal segments (not shown) in addition to fourth metal segments 540A, 540B, 540C, and 540D. In some embodiments, a plurality of fourth metal segments includes a subset of fourth metal segments 540A, 540B, 540C, and 540D.

In some embodiments, each fourth metal segment of a plurality of fourth metal segments has a width corresponding to a predetermined minimum width for fourth metal level 540L. In some embodiments, each fourth metal segment of a plurality of fourth metal segments has a width corresponding to a predetermined minimum width for a metal four layer of an IC process.

In some embodiments, fourth metal segment 540A overlaps third metal segments 130A and 130B, fourth metal segment 540B overlaps third metal segments 130C and 130D, fourth metal segment 540C overlaps third metal segments 130E and 130F, and fourth metal segment 540D overlaps third metal segments 130G and 130H, described above with respect to IC structure 100 and FIGS. 1A, 1B, and 1C. In this configuration, fourth vias 145 electrically connect fourth metal segment 540A to third metal segments 130A and 130B, fourth metal segment 540B to third metal segments 130C and 130D, fourth metal segment 540C to third metal segments 130E and 130F, and fourth metal segment 540D to third metal segments 130G and 130H.

In some embodiments, fourth metal segment 540A overlaps third metal segment 230A, fourth metal segment 540B overlaps third metal segment 230B, fourth metal segment 540C overlaps third metal segment 230C, and fourth metal segment 540D overlaps third metal segment 230D, described above with respect to IC structure 200 and FIGS. 2A, 2B, and 2C. In this configuration, fourth vias 245 electrically connect fourth metal segment 540A to third metal segment 230A, fourth metal segment 540B to third metal segment 230B, fourth metal segment 540C to third metal segment 230C, and fourth metal segment 540D to third metal segment 230D.

In some embodiments, fourth metal segment 540A overlaps third metal segment 330A, fourth metal segment 540B overlaps third metal segment 330B, fourth metal segment 540C overlaps third metal segment 330C, and fourth metal segment 540D overlaps third metal segment 330D, described above with respect to IC structure 300 and FIGS. 3A, 3B, and 3C. In this configuration, fourth vias 345 electrically connect fourth metal segment 540A to third metal segment 330A, fourth metal segment 540B to third metal segment 330B, fourth metal segment 540C to third metal segment 330C, and fourth metal segment 540D to third metal segment 330D.

Power straps 550A, 550B, 550C, and 550D are electrically conductive line segments oriented in second direction Y. Power strap 550A overlaps power rail 100A at the location at which fourth metal segment 540A overlaps power rail 100A, power strap 550B overlaps power rail 100B at the location at which fourth metal segment 540B overlaps power rail 100B, power strap 550C overlaps power rail 100A at the location at which fourth metal segment 540C overlaps power rail 100A, and power strap 550D overlaps power rail 100B at the location at which fourth metal segment 540D overlaps power rail 100B.

Power straps 550A, 550B, 550C, and 550D are also described as a plurality of power straps. In the embodiment shown in FIGS. 5A and 5B, a plurality of power straps includes four power straps. In some embodiments, a plurality of power straps includes power straps (not shown) in addition to power straps 550A, 550B, 550C, and 550D. In some embodiments, a plurality of power straps includes a subset of power straps 550A, 550B, 550C, and 550D.

In some embodiments, each power strap of a plurality power straps has a width corresponding to two times a predetermined minimum width for power strap level 550L. In some embodiments, each power strap of a plurality power straps has a width greater than two times a predetermined minimum width for power strap level 550L.

In some embodiments, each power strap of a plurality of power straps has a width corresponding to two times a predetermined minimum width for a metal five layer of an IC process. In some embodiments, each power strap of a plurality of power straps has a width greater than two times a predetermined minimum width for a metal five layer of an IC process.

Fifth vias 555 are vias positioned between fourth metal level 540L and power strap level 550L at the locations at which power strap 550A overlaps fourth metal segment 540A, power strap 550B overlaps fourth metal segment 540B, power strap 550C overlaps fourth metal segment 540C, and power strap 550D overlaps fourth metal segment 540D. In some embodiments, fifth vias 555 are single vias positioned at the locations at which power strap 550A overlaps fourth metal segment 540A, power strap 550B overlaps fourth metal segment 540B, power strap 550C overlaps fourth metal segment 540C, and power strap 550D overlaps fourth metal segment 540D.

By this configuration, power strap 550A is electrically connected to fourth metal segment 540A, power strap 550B is electrically connected to fourth metal segment 540B, power strap 550C is electrically connected to fourth metal segment 540C, and power strap 550D is electrically connected to fourth metal segment 540D.

By the configuration of IC structure 500 in combination with any one of IC structure 100, IC structure 200, IC structure 300, or IC structure 400, power strap 550A is electrically connected to power rail 100A, power strap 550B is electrically connected to power rail 100B, power strap 550C is electrically connected to power rail 100A, and power strap 550D is electrically connected to power rail 100B.

Figure 6:
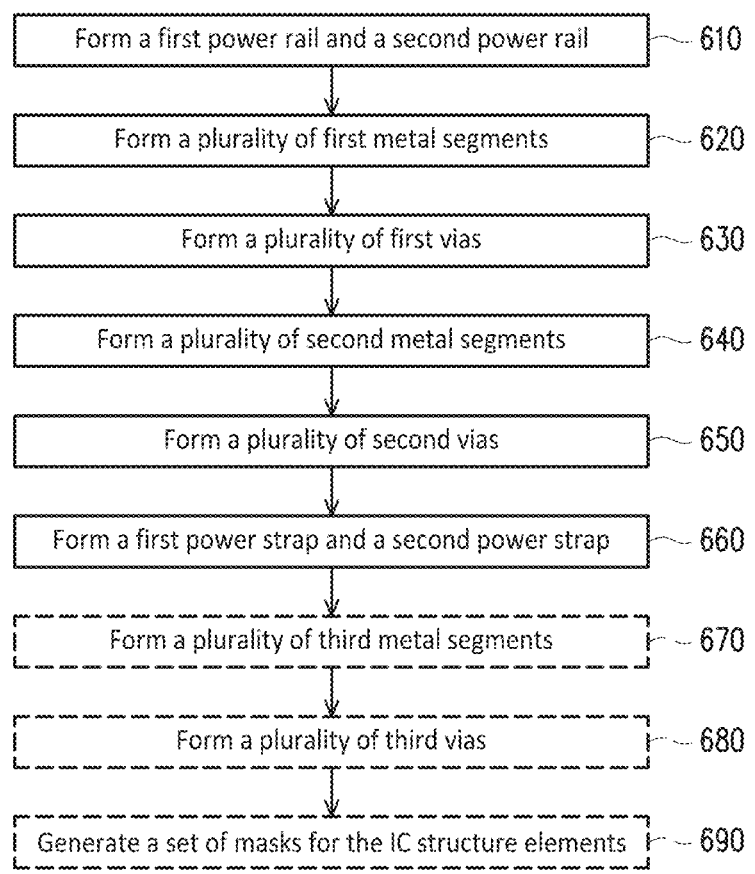
FIG. 6 is a flowchart of a method of forming an IC structure, in accordance with some embodiments.

FIG. 6 is a flowchart of a method 600 of forming an IC structure, in accordance with one or more embodiments. Method 600 is implemented to one or more of manufacture or design an IC structure such as one or more of IC structures 100, 200, 300, 400, and 500, discussed above. If method 600 is performed to design an IC structure, method 600 is implemented by a processor configured to execute a set of computer-readable instructions that interface with a circuit design system to design and render a layout of an IC structure having the features discussed herein.

The sequence in which the operations of method 600 are depicted in FIG. 6 is for illustration only; the operations of method 600 are capable of being executed in sequences that differ from that depicted in FIG. 6. In some embodiments, operations in addition to those depicted in FIG. 6 are performed before, between and/or after the operations depicted in FIG. 6.

At operation 610, a first power rail and a second power rail are formed. The first power rail and the second power rail are positioned in parallel at a power rail level and are oriented in a power rail direction.

In some embodiments, forming a first power rail and a second power rail includes forming first power rails 100A and 100B, discussed above with respect to IC structures 100, 200, 300, and 400.

At operation 620, a plurality of first metal segments is formed at a first metal level immediately above the power rail level. The plurality of first metal segments includes first metal segments oriented in a first metal direction perpendicular to the power rail direction. Each first metal segment of the plurality of first metal segments overlaps one or both of the first power rail or the second power rail. Forming the plurality of first metal segments comprises forming each first metal segment of the plurality of first metal segments having a width corresponding to a predetermined minimum width for the first metal level.

In some embodiments, forming a plurality of first metal segments includes forming first metal segments 110A, 110B, 110C, 110D, 110E, 110F, 110G, and 110H, discussed above with respect to IC structure 100. In some embodiments, forming a plurality of first metal segments includes forming first metal segments 210A, 210B, 210C, and 210D, discussed above with respect to IC structure 200. In some embodiments, forming a plurality of first metal segments includes forming first metal segments 310A, 310B, 310C, 310D, 310E, 310F, 310G, and 310H, discussed above with respect to IC structure 300. In some embodiments, forming a plurality of first metal segments includes forming first metal segments 310A, 310B, 310C, 310D, 310E, 310F, 310G, 310H, 410A, and 410B, discussed above with respect to IC structure 400.

At operation 630, a plurality of first vias is formed between the power rail level and the first metal level. Each via of the plurality of first vias is a single via positioned at a location where a corresponding first metal segment of the plurality of first metal segments overlaps the first power rail or the second power rail.

In some embodiments, forming a plurality of first vias includes forming plurality of first vias 115 between power rails 100A and 100B and first metal segments 110A, 110B, 110C, 110D, 110E, 110F, 110G, and 110H, discussed above with respect to IC structure 100. In some embodiments, forming a plurality of first vias includes forming plurality of first vias 215 between power rails 100A and 100B and first metal segments 210A, 210B, 210C, and 210D, discussed above with respect to IC structure 200. In some embodiments, forming a plurality of first vias includes forming plurality of first vias 315 between power rails 100A and 100B and first metal segments 310A, 310B, 310C, 310D, 310E, 310F, 310G, and 310H, discussed above with respect to IC structure 300. In some embodiments, forming a plurality of first vias includes forming plurality of first vias 315 between power rails 100A and 100B and first metal segments 310A, 310B, 310C, 310D, 310E, 310F, 310G, 310H, 410A, and 410B, discussed above with respect to IC structure 400.

At operation 640, a plurality of second metal segments is formed at a second metal level immediately above the first metal level. Each second metal segment of the plurality of second metal segments is oriented in the power rail direction, at least one second metal segment of the plurality of second metal segments overlaps the first power rail, and at least one second metal segment of the plurality of second metal segments overlaps the second power rail.

In some embodiments, forming a plurality of second metal segments comprises forming second metal segments 120A, 120B, 120C, and 120D, discussed above with respect to IC structure 100. In some embodiments, forming a plurality of second metal segments comprises forming second metal segments 220A, 220B, 220C, and 220D, discussed above with respect to IC structure 200. In some embodiments, forming a plurality of second metal segments comprises forming second metal segments 320A and 320B, discussed above with respect to IC structures 300 and 400.

At operation 650, a plurality of second vias is formed between the first metal level and the second metal level. Each second via of the plurality of second vias is a single via formed at a location above a corresponding first via of the plurality of first vias.

In some embodiments, forming a plurality of second vias includes forming plurality of second vias 125 between first metal segments 110A, 110B, 110C, 110D, 110E, 110F, 110G, and 110H and second layer of metal segments 120A, 120B, 120C, and 120D, discussed above with respect to IC structure 100. In some embodiments, forming a plurality of second vias includes forming plurality of second vias 225 between first metal segments 210A, 210B, 210C, and 210D and second layer of metal segments 220A, 220B, 220C, and 220D, discussed above with respect to IC structure 200. In some embodiments, forming a plurality of second vias includes forming plurality of second vias 325 between first metal segments 310A, 310B, 310C, 310D, 310E, 310F, 310G, and 310H and second layer of metal segments 320A and 320B, discussed above with respect to IC structure 300. In some embodiments, forming a plurality of second vias includes forming plurality of second vias 325 between first metal segments 310A, 310B, 310C, 310D, 310E, 310F, 310G, 310H, 410A, and 410B and second layer of metal segments 320A and 320B, discussed above with respect to IC structure 400.

At operation 660, a first power strap and a second power strap are formed at a power strap level above the second metal level. Forming the first power strap comprises forming the first power strap having a width greater than a predetermined minimum width for the power strap level. Forming the second power strap comprises forming the second power strap having the width greater than the predetermined minimum width for the power strap level. In some embodiments, forming a first power strap and a second power strap includes forming power straps 550A, 550B, 550C, and 550D, discussed above with respect to IC structure 500.

Operations 610-660 thereby establish an electrical connection from the first power strap to the first power rail and from the second power strap to the second power rail. In some embodiments, establishing an electrical connection from the first power strap to the first power rail and from the second power strap to the second power rail includes operations in addition to operations 610-660.

In some embodiments, at operation 670, a plurality of third metal segments is formed at a third metal level immediately above the second metal level. The plurality of third metal segments is oriented in the first metal level direction. In some embodiments, a plurality of third metal segments includes a first set of third metal segments alternating with a second set of third metal segments.

In some embodiments, forming a plurality of third metal segments comprises forming third metal segments 130A, 130B, 130C, 130D, 130E, 130F, 130G, and 130H, discussed above with respect to IC structure 100. In some embodiments, forming a plurality of third metal segments comprises forming third layer of metal segments 230A, 230B, 230C, and 230D, discussed above with respect to IC structure 200. In some embodiments, forming a plurality of third metal segments comprises forming third layer of metal segments 330A, 330B, 330C, and 330D, discussed above with respect to IC structures 300 and 400.

In some embodiments, operation 680 includes forming a plurality of third vias. In some embodiments, a plurality of third vias electrically connects a first set of third metal segments to at least one second metal segment of a plurality of second metal segments overlapping a first power rail and electrically connects a second set of third metal segments to at least one second metal segment of the plurality of second metal segments overlapping a second power rail. In some embodiments, at operation 690, a new set of masks is generated based on the results of operations 610-680.

In some embodiments, forming a plurality of third vias includes forming third vias 135, discussed above with respect to IC structure 100. In some embodiments, forming a plurality of third vias includes forming third vias 235, discussed above with respect to IC structure 200. In some embodiments, forming a plurality of third vias includes forming third vias 335, discussed above with respect to IC structures 300 and 400.

Each of the various embodiments thereby establishes electrical connections between components of the power grid (which include power straps positioned at upper metal layers and power rails at lower layers using minimum-width metal elements and single vias in the layers between the power straps and the power rails) and thereby reduces IR losses, reduces an area/footprint impact of the power-grid (which increases space available for placement of other structures), or the like. By providing parallel paths having low resistance, one or more embodiments enable efficient power delivery, limited heat generation, and low susceptibility to EM.

Compared to approaches that use metal elements wider than minimum-width metal elements and/or multiple vias at locations where metal elements overlap, one or more embodiments provide power distribution to functional circuit elements with less impact on routing of other connections to those functional circuit elements.

Figure 7:
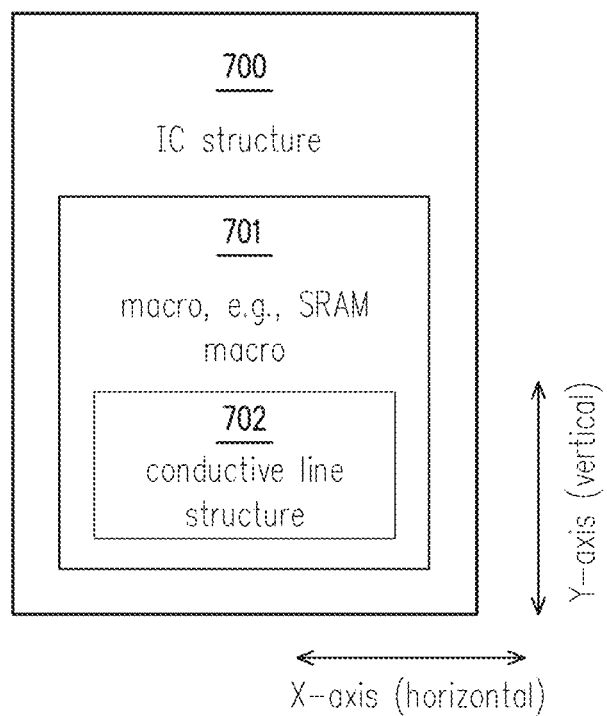
FIG. 7 is a block diagram of an IC structure, in accordance with at least one embodiment of the present disclosure.

FIG. 7 is a block diagram of an IC structure 700, in accordance with at least one embodiment of the present disclosure.

In FIG. 7, IC structure 700 includes, among other things, a circuit macro/module 701. In some embodiments, circuit macro/module 701 is understood in the context of an analogy to the architectural hierarchy of modular programming in which subroutines/procedures are called by a main program (or by other subroutines) to carry out a given computational function. In this context, IC structure 700 uses circuit macro/module 701 to form one or more given functions. Accordingly, in this context and in terms of architectural hierarchy, IC structure 700 is analogous to the main program and circuit macro/module (hereinafter, macro) 701 is analogous to subroutines/procedures. In some embodiments, macro 701 is a soft macro. In some embodiments, macro 701 is a hard macro. In some embodiments, macro 701 is a soft macro which is described/couched in register-transfer level (RTL) code. In some embodiments, synthesis, placement and routing have yet to have been performed on macro 701 such that the soft macro can be synthesized, placed and routed for a variety of process nodes. In some embodiments, macro 701 is a hard macro which is described/couched in a binary file format (e.g., Graphic Database System II (GDSII) stream format), where the binary file format represents planar geometric shapes, text labels, other information and the like of one or more layout diagrams of macro 701 in hierarchical form. In some embodiments, synthesis, placement and routing have been performed on macro 701 such that the hard macro is specific to a particular process node.

In some embodiments, macro 701 is an SRAM macro. In some embodiments, macro 701 is another macro such as another type of RAM, a ROM, phase lock loops (PLLs), special function circuits, or the like. Macro 701 includes, among other things, a conductive line region 702. In some embodiments, region 702 corresponds to a part of or an entirety of an instance of a standard cell structure, where the standard cell structure is included in a library of various standard cell structures.

Figure 8A:
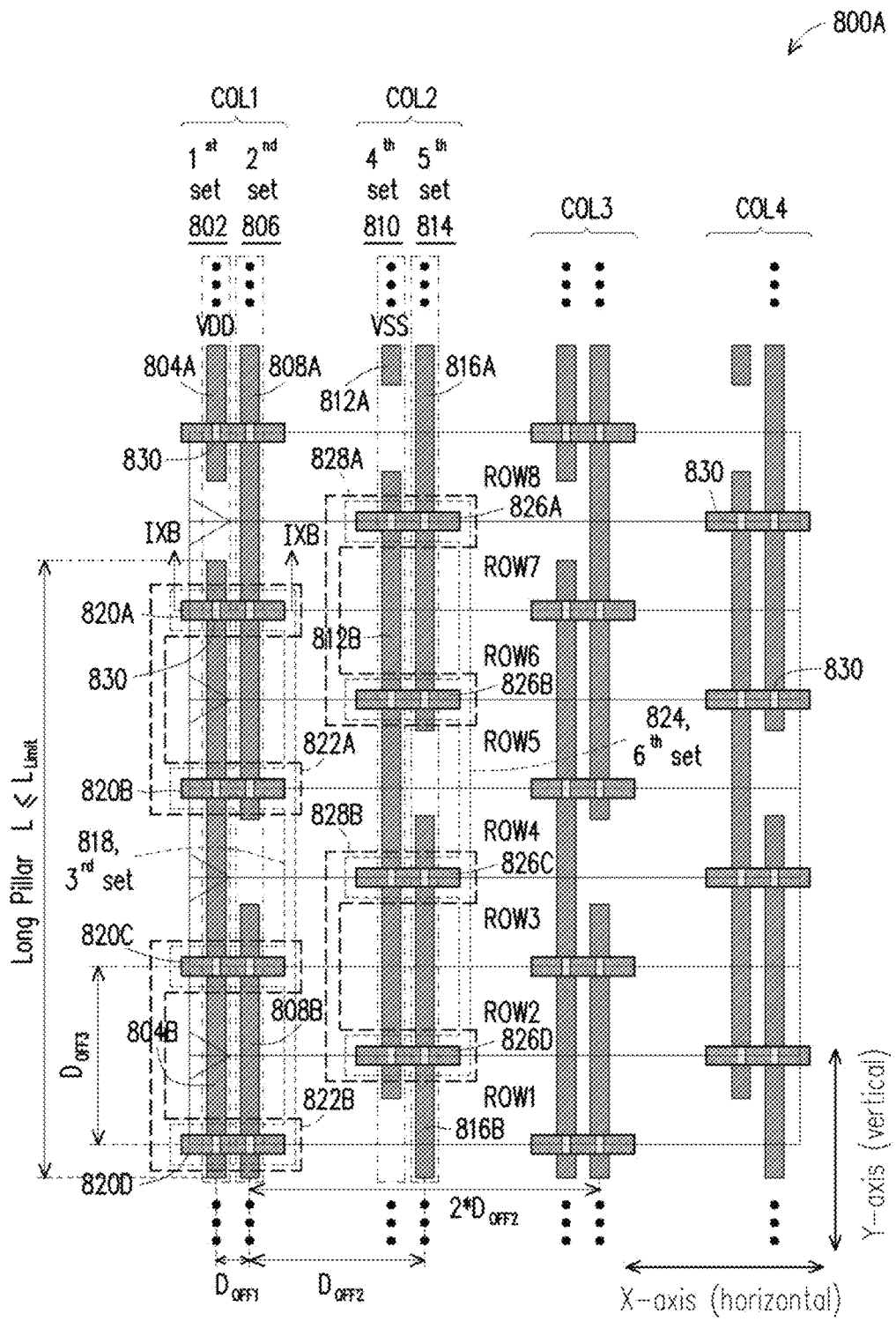
FIG. 8A is a layout diagram of a conductive line structure of an IC structure, in accordance with at least one embodiment of the present disclosure.

FIG. 8A is a layout diagram 800A of a conductive line structure 800A of an IC structure, in accordance with at least one embodiment of the present disclosure. In some embodiments, the IC structure is IC structure 700 of FIG. 7. Layout diagram 800A includes an example of a connected long pillar pair configuration.

In terms of arrangement, FIG. 8A is arranged into an array of rows (including rows ROW1-ROW8) and columns (including COL1-COL4). Each of the rows is arranged to be substantially parallel to a first direction. Relative to a second direction (which is substantially perpendicular to the first direction), each of rows ROW1-ROW8 has a height $H_{ROW}$. In FIG. 8A, the first and second directions are the corresponding vertical and horizontal. In some embodiments, the first and second directions are corresponding directions other than the vertical and horizontal directions. In some embodiments, each of the rows includes a predetermined number of the reference lines/tracks (not shown in FIG. 8A). In some embodiments, odd-numbered rows have a first conductivity and even-numbered rows have a second conductivity. In some embodiments, the odd-numbered rows are configured for PMOS technology and the even-numbered rows are configured for NMOS technology. In some embodiments, the odd-numbers rows are configured for NMOS technology and the even-numbered rows are configured for PMOS technology.

Layout diagram 800A includes sets of long pillar patterns, sets of short pillar patterns; and first via patterns 830. In particular, the sets of long pillar patterns include: first set 802 of long pillar patterns 804A-804B; a second set 806 of long pillar patterns 808A-808B; a fourth set 810 of long pillar patterns 812A-812B; and a fifth set 814 of long pillar patterns 816A-816B. In particular, the short pillar patterns include: a third set 818 of short pillar patterns 820A-820D; and a sixth set 824 of short pillar patterns 826A-826D. In FIG. 8A, each column is shown as a group of sets which includes two sets. For example, column COL1 includes first set 802 of long pillar patterns 804A-804B and second set 806 of long pillar patterns 808A-808B, and column COL2 includes fourth set 810 of long pillar patterns 812A-812B and fifth set 814 of long pillar patterns 816A-816B. In some embodiments, each column includes a group of sets which has a number of sets other than two. Via patterns 830 electrically connect short pillar patterns 820A-820D and 826A-826D of corresponding third set 818 and sixth 824 sets with corresponding ones of long pillar patterns 804A-804B, 808A-808B, 812A-812B and 816A-816B of corresponding first set 802, second 806 set, fourth set 810 and fifth set 814.

Members of first set 804, second set 806, fourth set 810, fifth set 814, and the like are located in a M(i) metallization layer, where i is a non-negative integer. Members of third set 818, sixth set 824, and the like are located in an M(i+1) metallization layer. In some embodiments, i=0. In some embodiments, i=1. In some embodiments, values of i other than i=0 or i=1 are contemplated.

Regarding members of each of first set 802, second set 806, fourth set 810 and fifth set 814 of long pillar patterns, they: are substantially the same length; are non-overlapping of each other; and have long axes which are substantially coaxial and substantially parallel to the first direction. In some embodiments, the first direction is the vertical direction. In some embodiments, amongst the long pillars (including long pillars 804A-804B, 808A-808B, 812A-812B and 816A-816B, not all of the long pillars are substantially the same length.

In terms of offsets, offsets shown in FIG. 8A include paired-set offsets in the second/horizontal direction, paired-set offsets in the first/vertical direction and intra-column offsets in the first/vertical direction. A paired-set offset in the second/horizontal direction occurs between horizontally-adjacent sets of long pillars. A paired-set offset in the first/vertical direction occurs between horizontally-adjacent sets. An inter-column offset in the first direction occurs between the sets of long pillars in a first column and the sets of long pillars in an adjacent second column.

An example of the paired-set offset in the second/horizontal direction is that second set 806 is offset in the second direction relative to first set 802 by an offset distance, $D_{OFF1}$. Fifth set 814 is offset in the second direction relative to fourth set 810 by the offset distance, $D_{OFF1}$. In some embodiments, offset distance $D_{OFF1}$ is the poly pitch, $P_{POLY}$, for the corresponding process node, where $D_{OFF1}=D_{POLY}$. In some embodiments, other values of $D_{OFF1}$ are contemplated. Also, pairs of first set 802 & fourth set 810, second set 806 & fourth set 814, and the like, are offset in the second direction relative to each other by an offset distance, $D_{OFF2}$. Adjacent columns are offset in the second direction relative to each other by an offset distance, $D_{OFF2}$. In FIG. 8A, offset distance $D_{OFF2}$ is an approximately six times multiple of offset distance $D_{OFF1}$ such that $D_{OFF2} \approx 6*D_{OFF1}$. In some embodiments, offset distance $D_{OFF2}$ is approximate multiple of offset distance $D_{OFF1}$ other than an approximately six time multiple. In some embodiments, $D_{OFF2}$ is one-half of the power pitch, $P_V$, between adjacent power rails or stripes for the corresponding process node, where $D_{OFF2}=\frac{1}{2}P_V$. In some embodiments, other values of $D_{OFF2}$ are contemplated.

In terms of sizes shown in FIG. 8A, each of long pillar patterns 804A-804B, 808A-808B, 810A-810B, 816A-816B and the like has a length, L, less than or equal to a predetermined length, $L_{LIMIT}$, where $L \leq L_{LIMIT}$. In some embodiments, $L_{LIMIT}$ is substantially equal to, albeit without being greater than, the Blech length, $L_{Blech}$, where $L_{LIMIT} \approx L_{Blech}$ AND $L_{LIMIT} \leq L_{Blech}$. It is noted that $L_{Blech}$ represents a length of conductor below which substantially no electromigration occurs. In some embodiments, $L_{LIMIT}$ is a length other than Blech length, $L_{Blech}$.

An example of the paired-set offset in the first/vertical direction between horizontally-adjacent sets of long pillar patterns is that second set 806 (which is horizontally-adjacent to first set 802) is offset in the first/vertical direction by a vertical-separation distance of substantially one row height $H_{ROW}$ relative to first set 802. More particularly regarding the example, long pillar pattern 804B in first set 802 is offset by a vertical-separation distance of substantially four row heights $H_{ROW}$ relative to long pillar pattern 808A in second set 806. In some embodiments, the paired-set offset in the first/vertical direction has vertical-separation distance different than one row height $H_{ROW}$.

An example of an inter-column offset in the first/vertical direction between the sets of long pillars in a first column and the sets of long pillar patterns in an adjacent second column is that is first set 802 and second set 806 of long pillar patterns in column COL1 are offset in the first/vertical direction by a vertical-separation distance of substantially one row height $H_{ROW}$ relative to fourth set 810 and fifth set 814 of long pillar patterns in column COL2. More particularly regarding the example, long pillar pattern 812B in fourth set 810 of column COL2 is offset by a vertical-separation distance of substantially one row height $H_{ROW}$ relative to long pillar pattern 804B in first set 802 of column COL1, and long pillar pattern 816A in fifth set 814 of column COL2 is offset by a vertical-separation distance of substantially one row height $H_{ROW}$ relative to long pillar pattern 808A in second set 806 of column COL1. In some embodiments, the inter-column offset in the first/vertical direction has vertical-separation distance different than one row height $H_{ROW}$.

In FIG. 8A, the short pillar patterns 820A-820D, 826A-826D and the like are organized into according to rows ROW1-ROW8 and the like. Regarding members of each of third set third set 818 and sixth set 824 of short pillar patterns, they: are non-overlapping of each other; have long axes which are substantially parallel to the second direction; are overlapping of corresponding long pillar patterns 804A-804B, 808A-808B, 812A-812B and 816A-816B in corresponding first set 802, second set 806, fourth set 810 and fifth set 814; and are organized into groups. Members of third set 818 are aligned with each other relative to the second direction. Members of sixth set 824 are aligned with each other relative to the second direction. Adjacent members of third set 818 are offset in the first direction relative to each other by an offset distance, $D_{OFF3}$. In FIG. 8A, $D_{OFF3}$ is the size in the first direction of two rows. In some embodiments, $D_{OFF3}$ is a multiple of the size, $D_{SS}$, in the first direction of a standard cell, where $D_{OFF3}=\alpha*D_{SS}$, and where $\alpha$ is a positive real number. In some embodiments, other values of $D_{OFF3}$ are contemplated.

Furthermore, third set 818 of short pillar patterns is organized into groups 822A-822B, and sixth set 824 of short pillar patterns is organized into groups 828A-828B. Each of groups 822A-822B and 828A-828B has the same quantity, $Q_{822}$, of short pillar patterns 820A-820D. In FIG. 8A, for simplicity of illustration, quantity $Q_{822}$ of short pillar patterns is shown as two, $Q_{822}=2$. In some embodiments, other values for $Q_{822}$ are contemplated, where $Q_{822}$ is a positive integer and Q822>2.

Each group 822A-822B of third set 818 overlaps and is electrically connected between a corresponding pair of one of long pillar patterns 804A-804B in first set 802 and a corresponding one of long pillar patterns 808A-808B in second set 806. An example of such a pair is long pillar pattern 804B in first set 802 and long pillar pattern 808A in second set 806. Accordingly, in each of groups 822A-822B, each of corresponding short pillar patterns 820A-820D overlaps and is electrically connected between the corresponding pair of long pillar pattern 804B in first set 802 and long pillar pattern 808A in second set 806. In FIG. 8A, relative to the first/vertical direction, each short pillar pattern is located: substantially at a stub-distance from an end of one of the long pillar patterns which the short pillar pattern overlaps; and at a middle region of the other of the long pillar pattern which the short pillar pattern overlaps. As an example, short pillar pattern 820A is located at substantially a stub-distance from the end of long pillar pattern 804B and at a middle region of long pillar pattern 808A. A stub-distance ensures a sufficient amount of overlap between the end of the long pillar and the short pillar, and is dependent upon the alignment tolerance of the corresponding process node used to manufacture structures corresponding to the short pillar patterns, long pillar patterns, or the like.

In FIG. 8A, each of long pillar patterns 804A-804B in first set 802, and each of long pillar patterns 808A-808B in second set 806, is overlapped by a quantity $Q_{818}$ of corresponding short pillar patterns 820A-820D in third set 818, and is electrically connected to the same. In FIG. 8A, vertically-aligned and vertically-adjacent ones of long pillar patterns, including corresponding ones of long pillar patterns 804A-804B and 808A-808B, have a vertical separation distance of substantially one row height $H_{ROW}$. For example, vertically-aligned and vertically-adjacent long pillar patterns 808A and 808B have a vertical separation of substantially one row height $H_{ROW}$. In some embodiments, vertically-aligned and vertically-adjacent long pillar patterns have a vertical separation distance different than one row height $H_{ROW}$. In FIG. 8A, for simplicity of illustration, quantity $Q_{818}$ of short pillar patterns is shown as four, $Q_{818}=4$. In some embodiments, other values for $Q_{818}$ are contemplated, where $Q_{818}$ is a positive integer and $Q_{818}>3$. Quantity $Q_{818}$ is greater than quantity $Q_{822}$, where $Q_{822}$<where $Q_{818}$.

Figure 8B:
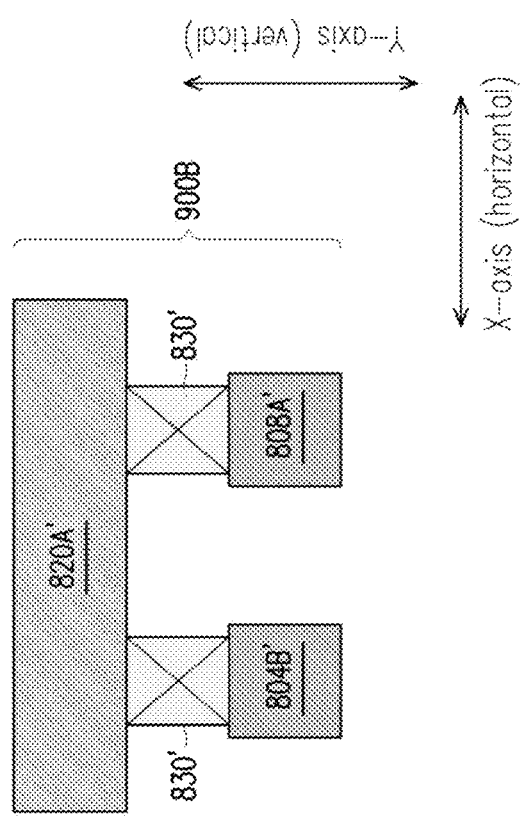
FIG. 8B is a cross-sectional diagram of a conductive line structure of an IC structure relating to the layout of FIG. 8A, in accordance with at least one embodiment of the present disclosure.

FIG. 8B is a cross-sectional diagram of a conductive line structure 800B of an IC structure, in accordance with at least one embodiment of the present disclosure. In some embodiments, the IC structure is IC structure 700 of FIG. 7. In some embodiments, conductive line structure 800B is fabricated at least in part according to layout 800A of FIG. 8A.

In FIG. 8B, conductive line structure 800B includes: long pillars 804B' and 808A'; vias 830'; and a short pillars 820A'. Long pillars 804B' and 808A' are conductive and correspond to long pillar patterns 804B and 808A of FIG. 8A. Vias 830' are conductive and correspond to via patterns 830 of FIG. 8A. Short pillar 820A' is conductive and corresponds to short pillar pattern 820A of FIG. 8A.

Advantages of using a connected long pillar pair configuration such as layout 800A of FIG. 8A include at least one of: a more robust grid (as contrasted with, e.g., a configuration of simple stripes according to another approach) without negatively impacting, e.g., routability or the like; reduced electromigration susceptibility, (as contrasted with, e.g., a configuration of simple stripes according to another approach) without negatively impacting, e.g., routability or the like; being appropriate/suitable to any metallization layer; or the like.

Figure 9A:
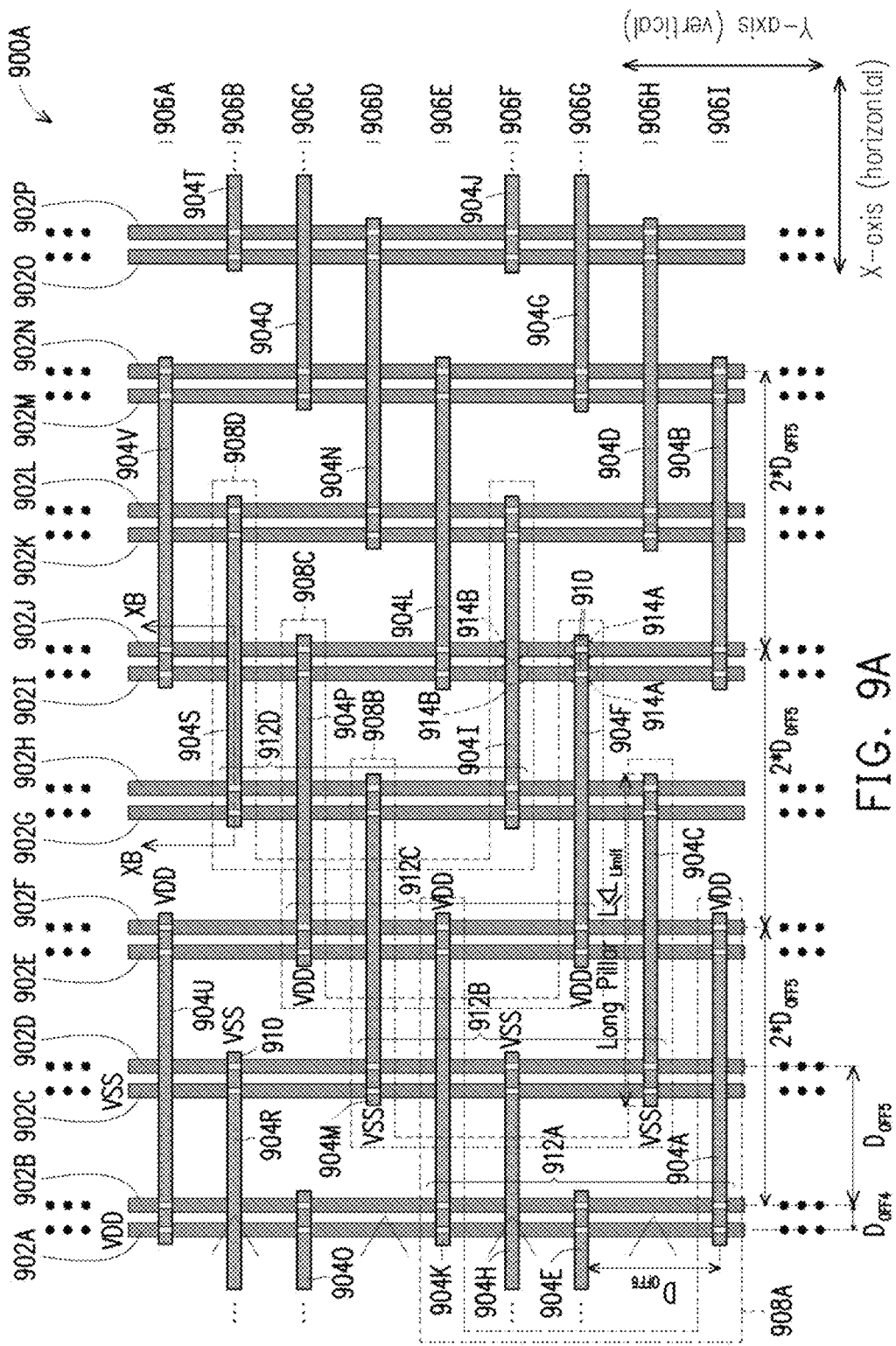
FIG. 9A is a layout diagram of a conductive line structure of an IC structure, in accordance with at least one embodiment of the present disclosure.

FIG. 9A is a layout diagram of a conductive line structure 900A of an IC structure, in accordance with at least one embodiment of the present disclosure. In some embodiments, the IC structure is IC structure 700 of FIG. 7. Layout diagram 900A includes an example of a connected long pillar pair configuration.

Layout diagram 900A includes line patterns 902A-902P, long pillar patterns 904A-904V, and via patterns 910. Via patterns 910 electrically connect long pillar patterns 904A-904V with corresponding ones of line patterns 902A-902P. Line patterns 902A-902P are located in an M(i) metallization layer, where i is a non-negative integer. Long pillar patterns 904A-904V are located in an M(i+1) metallization layer. In some embodiments, i=0. In some embodiments, i=1. In some embodiments, values of i other than i=0 or i=1 are contemplated.

Regarding line patterns 902A-902P, they: are non-overlapping of each other; have long axes which are substantially parallel to a first direction. In some embodiments, the first direction is the vertical direction. Line patterns 902A-902P are offset in a second direction relative to each other, the second direction being orthogonal to the first direction. In some embodiments, the second direction is the horizontal direction.

Line patterns 902A-902P are arranged in clusters, e.g., line patterns 902A & 902B. Within each cluster, members of the cluster, e.g., line patterns 902A & 902B, are offset in the second direction relative to each other by an offset distance, $D_{OFF4}$. In some embodiments, offset distance $D_{OFF4}$ is the poly pitch, $P_{POLY}$, for the corresponding process node, where $D_{OFF4}=P_{POLY}$. In some embodiments, other values of $D_{OFF4}$ are contemplated. Adjacent clusters are offset in the second direction relative to each other by an offset distance, $D_{OFF5}$. For example, line pattern 902B of the cluster 902A & 902B is offset from line pattern 902D of the cluster 902C & 902D by the distance $D_{OFF5}$. In some embodiments, $D_{OFF5}$ is the one-half of the power pitch, $P_V$, between adjacent power rails or stripes for the corresponding process node, where $D_{OFF5}=\frac{1}{2}P_V$. In some embodiments, other values of $D_{OFF5}$ are contemplated.

Long pillar patterns 904A-904V are organized into sets 906A-906I, for which the long pillar pattern members of each set: are non-overlapping of each other; have long axes which are substantially coaxial and substantially parallel to the second direction; are offset in the second direction relative to each other; and are overlapping of corresponding ones of line patterns 902A-902P. Long pillar patterns 904A-904V also are organized into groups 908A-908D and the like. A collection of groups is referred to as a unit. Each unit includes F groups, where F is a positive integer. In FIG. 9A, F=4. In some embodiments, values of F other than 4 are contemplated. Regarding groups 908A-908D and the like, they: are offset in the first direction relative to each other; and each have a same quantity of the long pillar patterns. For each of groups 908A-908D and the like, member long pillar patterns of the group: are non-overlapping of each other; and are offset, and aligned, in the second direction relative to each other.

Line patterns 902A-902P are arranged into bunches, each bunch including J clusters, with the clusters being offset in the second direction from each other, where J is a positive integer. Each cluster includes K ones of line patterns 902A-902P, where K is a positive integer. In FIG. 9A, J is four, J=4, and K is two, K=2. In some embodiments, values of J other than four are contemplated. In some embodiments, values of K other than two are contemplated. The clusters of line patterns 902A-902P include the clusters of line patterns 902A & 902B, 902C & 902D, 902E & 902F, and the like. In FIG. 9A, examples of a bunch include the following: a bunch including clusters of line patterns of line patterns 902A & 902B, 902C & 902D, 902E & 902F and 902G & 902H; a bunch including clusters of line patterns of line patterns 902C & 902D, 902E & 902F, 902G & H and 902I & 902J; and the like. For each of sets 906A-906I of long pillar patterns, each of the long pillar pattern members thereof overlaps J−1 clusters. Accordingly, in FIG. 9A, for each of sets 906A-906I of long pillar patterns, each of the long pillar pattern members thereof overlaps J−1=4−1=3 clusters. Also for each of sets 906A-906I of long pillar patterns, each of the long pillar pattern members thereof is electrically connected to each of the members of J−2 clusters. Accordingly, in FIG. 9A, for each of sets 906A-906I of long pillar patterns, each of the long pillar pattern members thereof is electrically connected to each of the members of J−2=4−2=2 clusters.

Where long pillar pattern patterns 904A-904V cross over corresponding portions of line patterns 902A-902P, two types of intersections are described, namely a functional intersection 914A and a flyover intersection 914B. Regarding a conductive line structure that will be fabricated at least in part according to layout 800A, and for a functional intersection 914A, corresponding ones of long pillar pattern patterns 904A-904V will be functionally connected (electrically connected) to corresponding ones of underlying line patterns 902A-902P through corresponding via patterns 910. Regarding a conductive line structure that will be fabricated at least in part according to layout 800A, and for a flyover intersection 914B, corresponding ones of long pillar pattern patterns 904A-904V will NOT be functionally connected (electrically connected) to corresponding ones of underlying line patterns 902A-902P because no via patterns 910 are present at flyover intersections 914B.

For a reference portion 912A-912B and the like of each of line patterns 902A-902P, a number, Q1, of the long pillar patterns which overlaps the reference portion is greater than a second number, Q2, of long pillar patterns which are electrically connected to the reference portion (or which intersect in the form of functional intersections rather than flyover intersections). In FIG. 9A, Q2=Q1−1. In some embodiments, other relations between Q2 and Q1 are contemplated.

As an example, consider reference portion 912B of each of line patterns 902C and 902D. Long pillar patterns 904C, 904H, 904K and 904M overlap reference portion 912B of line patterns 902C and 902D. In the example, the first number of long pillar patterns 904A-904V which overlaps reference portion 912B of each of line patterns 902C and 902D is four, Q1=4. Of the overlapping ones of the long pillar patterns, long pillar patterns 904C, 904H and 904M overlap reference portion 912B of line patterns 902C and 902D in the form of functional intersections 914A. By contrast, long pillar pattern 904K overlaps reference portion 912B of line patterns 902C and 902D in the form of a flyover intersection 914B. Accordingly, in the example, the second number of long pillar patterns which are electrically connected to reference portion 912B of each of line patterns 902C and 902D is three, Q2=3 such that (Q2=3)<(Q1=4). Furthermore, in the example, the number F of groups in a unit is Q1, where F=Q1=4, and such that Q2=F−1=3.

Figure 9B:
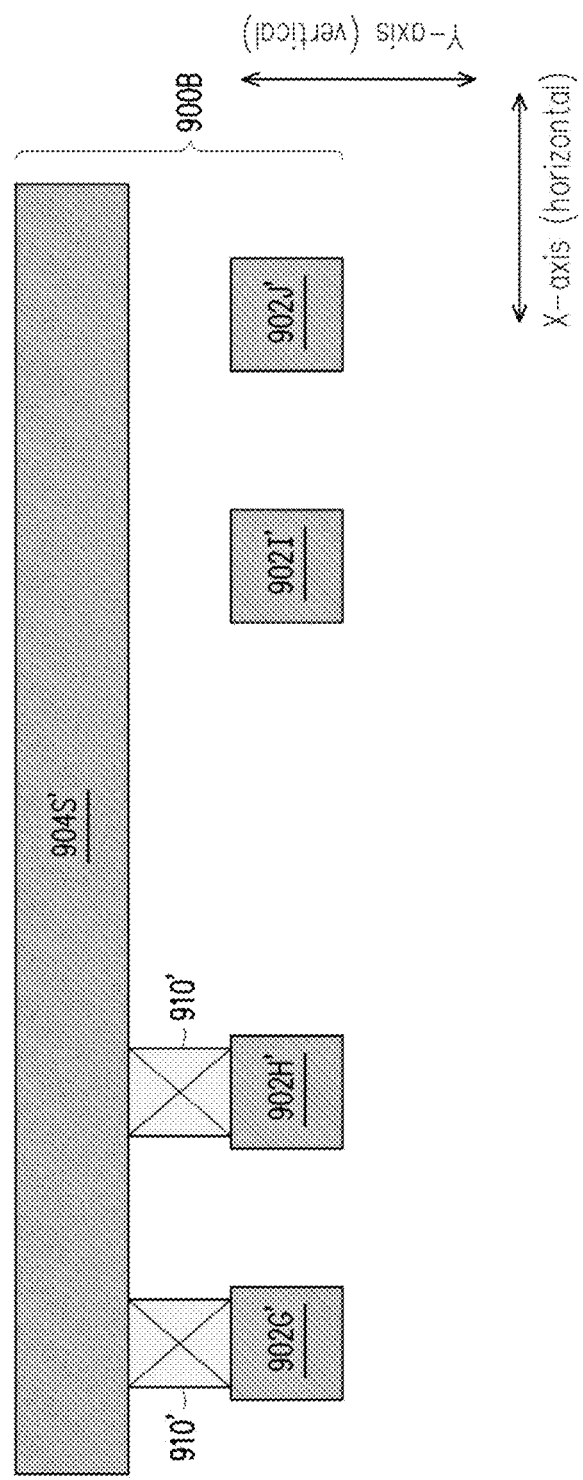
FIG. 9B is a cross-sectional diagram of a conductive line structure of an IC structure relating to the layout of FIG. 9A, in accordance with at least one embodiment of the present disclosure.

FIG. 9B is a cross-sectional diagram of a conductive line structure 900B of an IC structure, in accordance with at least one embodiment of the present disclosure. In some embodiments, the IC structure is IC structure 700 of FIG. 7. In some embodiments, conductive line structure 900B is fabricated at least in part according to layout 900A of FIG. 9A.

In FIG. 9B, conductive line structure 900B includes: lines 902G', 902H', 902I' and 902J'; vias 910'; and a long pillar 904S'. Lines 902G', 902H', 902I' and 902J' are conductive and correspond to line patterns 902G, 902H, 902I and 902J. Vias 910' are conductive and correspond to via patterns 910 of FIG. 9A. Long pillar 904S' is conductive and corresponds to long pillar pattern 904S of FIG. 9A.

Advantages of using a connected long pillar pair configuration such as layout 900A of FIG. 9A include at least one of: a more robust grid (as contrasted with, e.g., a configuration of simple stripes according to another approach) without negatively impacting, e.g., routability or the like; reduced electromigration susceptibility, (as contrasted with, e.g., a configuration of simple stripes according to another approach) without negatively impacting, e.g., routability or the like; being appropriate/suitable to any metallization layer; or the like.

Figure 10A:
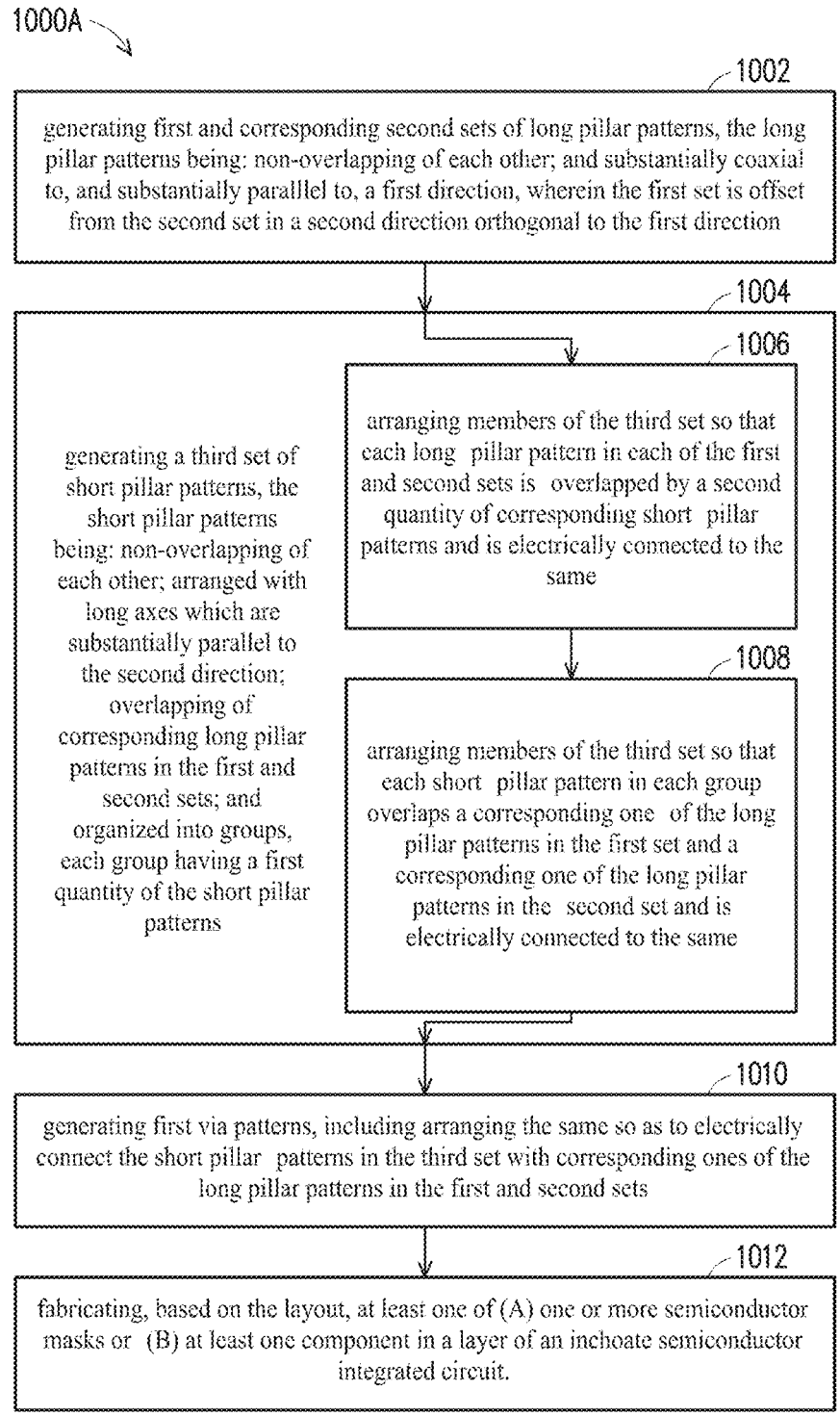
FIG. 10A is a flowchart of a method of generating a layout of an IC structure, in accordance with some embodiments.

FIG. 10A is a flowchart of a method 1000A of generating a layout of an IC structure, in accordance with some embodiments. In some embodiments, method 1000 is used to generate an instance of layout diagram 800A of conductive line structure 800B of an IC structure.

In FIG. 10A, the flowchart of method 1000A includes blocks 1002-1012. At least one of blocks 1002, 1004 (which includes blocks 1006-1008) or 1010 is executed by a processor of a computer. An example of the processor is a processor 1102 of FIG. 11 (discussed below). An example of the computer is an electronic design automation (EDA) system 1100 of FIG. 11 (discussed below). In some embodiments, each of blocks 1002-1010 is executed by the processor of the computer. In some embodiments, the layout generated by method 1000 is stored on a non-transitory computer-readable medium. An example of the non-transitory computer-readable medium is layout 1107 of FIG. 11 (discussed below).

At block 1002, first and corresponding second sets of long pillar patterns are generated. Examples of the first and second sets of long pillar patterns are first set 802 of long pillar patterns 804A-804B of FIG. 8A and corresponding second set 806 of long pillar patterns 808A-808B of FIG. 8A. Such long pillar patterns are: non-overlapping of each other; and substantially coaxial to, and substantially parallel to, a first direction. The first set is offset from the second set in a second direction orthogonal to the first direction. From block 1002, flow proceeds to block 1004.

At block 1004, a third set of short pillar patterns is generated. An example of the third set of short pillar patterns is set 818 of short pillar patterns 820A-820D of FIG. 8A. Such short pillar patterns are: non-overlapping of each other; arranged with long axes which are substantially parallel to the second direction; overlapping of corresponding long pillar patterns in the first and second sets; and organized into groups. Examples of such a group are groups 822A-822B of FIG. 8A. Each such group has a first quantity of the short pillar patterns. In the example of FIG. 8A, the first quantity $Q_{822}$ is two, where $Q_{822}=2$. In some embodiments, other values for $Q_{822}$ are contemplated, where $Q_{822}$ is a positive integer and $Q_{822}>2$.

Again, block 1004 includes blocks 1006-1008. Within block 1004, flow proceeds to block 1006. At block 1006, members of the third set are arranged so that each long pillar pattern in each of the first and second sets is overlapped by a second quantity of corresponding short pillar patterns and is electrically connected to the same. In the example of FIG. 8A, the second quantity $Q_{818}$ is three, where $Q_{818}=3$, and where $Q_{818}$ is greater than $Q_{822}$ such that where $Q_{822}<Q_{818}$. From block 1006, flow proceeds to block 1008.

At block 1008, members of the third set are arranged so that each short pillar pattern in each group overlaps a corresponding one of the long pillar patterns in the first set and a corresponding one of the long pillar patterns in the second set and is electrically connected to the same. In the example of FIG. 8A, e.g., long pillar pattern 804B is overlapped by short pillar patterns 820A-820D through corresponding via patterns 830. From block 1008, flow exits block 1004 and proceeds to block 1010.

At block 1010, first via patterns are generated, which includes arranging the same so as to electrically connect the short pillar patterns in the third set with corresponding ones of the long pillar patterns in the first and second sets. In the example of FIG. 8A, e.g., Via patterns 830 electrically connect long pillar pattern 804B to short pillar patterns 820A-820D. From block 1010, flow proceeds to block 1012. At block 1012, based on the layout, at least one of (A) one or more semiconductor masks is fabricated (see FIG. 12, discussed below) or (B) at least one component in a layer of an inchoate semiconductor integrated circuit is fabricated (again, see FIG. 12, discussed below).

Figure 10B:
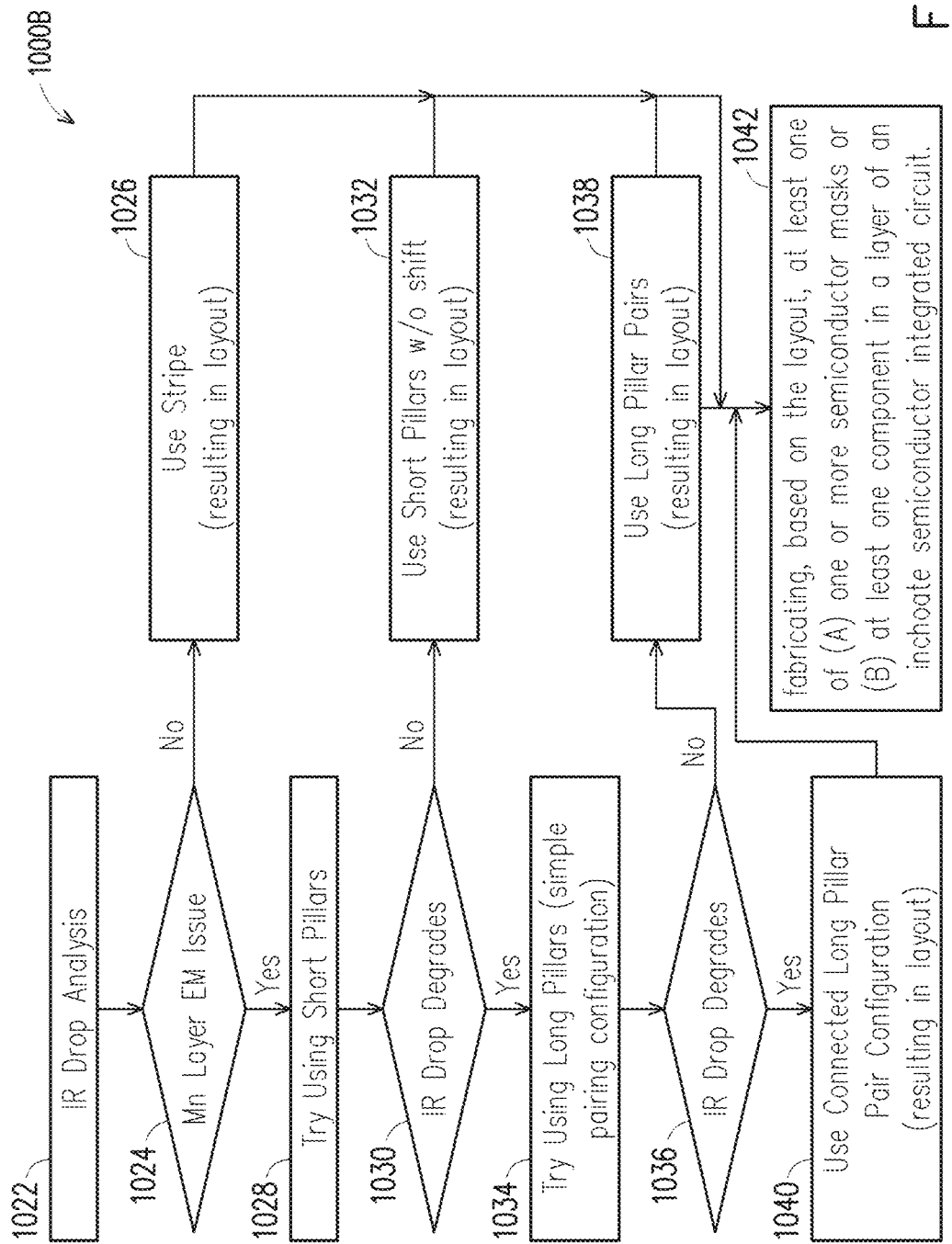
FIG. 10B is a high level process flow of a method of shifting at least one pillar of an IC structure in a layout, in accordance with at least one embodiment of the present disclosure.

FIG. 10B is a high level process flow of a method 1000B of shifting at least one pillar of an IC structure in a layout, in accordance with at least one embodiment of the present disclosure.

In FIG. 10B, the flowchart of method 1000B includes blocks 1022-1042. At least one of blocks 1022-1040 is executed by a processor of a computer. An example of the processor is a processor 1102 of FIG. 11 (discussed above). An example of the computer is an electronic design automation (EDA) system 1100 of FIG. 11 (discussed below). In some embodiments, each of blocks 1022-1040 is executed by the processor of the computer. In some embodiments, the layout generated by method 1000B is stored on a non-transitory computer-readable medium. An example of the non-transitory computer-readable medium is layout 1107 stored in memory 1104 of FIG. 11 (discussed below).

At block 1022, an IR drop analysis is executed for conductive segments in a layer $M_n$. For the IR drop analysis of block 1022, an attempt is made to use stripes, wherein a stripe is a conductive line which is longer than a long pillar (where a length of a long pillar is related to the Blech length, $L_{Blech}$, discussed above). For block 1022, it is assumed that an IR drop exhibited by the stripes satisfies is less than or equal to a corresponding maximum reference value. From block 1022, flow proceeds to block 1024 wherein a determination is made whether there is an electromigration issue in any of one or more stripes in the $M_n$ layer. In some embodiments, the determination of an whether there is an electromigration issue is based on test data, details of the grain structure for the conductors under consideration, the metal deposition process used to form the conductors under consideration, or the like.

If the result of block 1024 is negative, then the process flow proceeds to block 1026 in which a stripe is used into the layout, resulting in the layout. In some embodiments, a stripe is a conductive line which is longer than a long pillar (where a length of a long pillar is related to the Blech length, $L_{Blech}$, discussed above). From block 1026, the process flow then proceeds to block 1042 where, based on the layout, at least one of (A) one or more semiconductor masks is fabricated (see FIG. 12, discussed below) or (B) at least one component in a layer of an inchoate semiconductor integrated circuit is fabricated (again, see FIG. 12, discussed below).

If the result of block 1024 is positive, i.e., an electromigration issue is determined in the layout, then the process flow proceeds to block 1028. At block 1028, an attempt is made to use short pillars. Execution of block 1028 causes the insertion of short pillars into the layout in replacement of corresponding stripe(s) having the electromigration issue. An example of the short pillars are short pillars 1302 and 1304 of FIG. 13A (discussed below). The process flow then proceeds to block 1030 in which a determination is made whether an IR drop exhibited by the short pillars (which were introduced as replacements of the corresponding stripe(s) at block 1028) has degraded beyond a corresponding threshold relative to the IR drop(s) of the corresponding stripe(s). If the result of block 1030 is negative, then the process flow proceeds to block 1032 in which the short pillars (see block 1028) are used, resulting in the layout. At block 1032, the short pillars are used without having to shift track-aligned positions of one or more of the short pillars such that the short pillars remain co-track aligned (for shifting, e.g., see 1514 of FIG. 15, discussed below). From block 1032, the process flow then proceeds to block 1042 (discussed above).

If the result of block 1030 is positive, then the process flow proceeds to block 1034 which tries to use long pillars in a simple pairing configuration. Execution of block 1034 causes the insertion of long pillars in a simple pairing configuration into the layout in replacement of corresponding stripe(s) which were determined in block 1024 as having the electromigration issue. In the simple pairing configuration of long pillars, direct electrical connections are made between two members of a first pair of long pillars (intra-pair connections), but no direct electrical connection is made between the first pair of long pillars and a second pair of long pillars.

From block 1034, the process flow then proceeds to block 1036 in which a determination is made whether an IR drop exhibited by the simple pairing configuration of long pillars (which was introduced as replacements of the corresponding stripe(s) at block 1034) has degraded beyond a corresponding threshold relative to the IR drop(s) of the corresponding stripe(s). If the result of block 1036 is negative, then the process flow proceeds to block 1038 in which the simple pairing configuration of long pillars is used, resulting in the layout. From block 1038, the process flow then proceeds to block 1042 (discussed above).

If the result of block 1036 is positive, then the process flow proceeds to block 1040 which uses a connected long pillar pair configuration, resulting in the layout. In the connected long pillar pair configuration of long pillars, intra-pair connections are made and inter-pair connections are made. An example of a first pair of long pillar patterns having intra-pair and inter-pair connections is the pair of long pillar pattern 804B and long pillar pattern 808A of FIG. 8A, which: are intra-pair connected by short pillar patterns 820A and 820B as well as corresponding via patterns 830; and for which member long pillar pattern 804B is inter-pair connected by short pillar patterns 820C and 820D as well as corresponding via patterns 830 to long pillar pattern 808B, where long pillar pattern 808B is a member of a second pair. Another example of a first pair of long pillar patterns having intra-pair and inter-pair connections is the pair of long pillar pattern 904F and long pillar pattern 904P of FIG. 9A, which: are intra-pair connected by line patterns 902E, 902F, 902I and 902J as well as corresponding via patterns 910; and are inter-pair connected by line patterns 902E, 902F, 902I and 902J as well as corresponding via patterns 910 to at least long pillar patterns 904A and 904K, where long pillar patterns 904A and 904K are members of a second pair. In FIG. 9A, the noted second pair is included in a corresponding second group of long pillar patterns which includes not only long pillar patterns 904A and 904K but also long pillar pattern 904U. In some embodiments, the second group further includes other corresponding long pillar patterns which are vertically-aligned with long pillar patterns 904A, 904K and 904U, where the other corresponding long pillar patterns are not shown in FIG. 9A but are suggested by the ellipses at the top and bottom of FIG. 9A. In some embodiments, the noted first pair is included in a corresponding first group which further includes other corresponding long pillar patterns which are vertically-aligned with long pillar patterns 904F and 904P, where the other corresponding long pillar patterns are not shown in FIG. 9A but are suggested by the ellipses at the top and bottom of FIG. 9A. From block 1040, the process flow then proceeds to block 1042 (discussed above).

Figure 11:
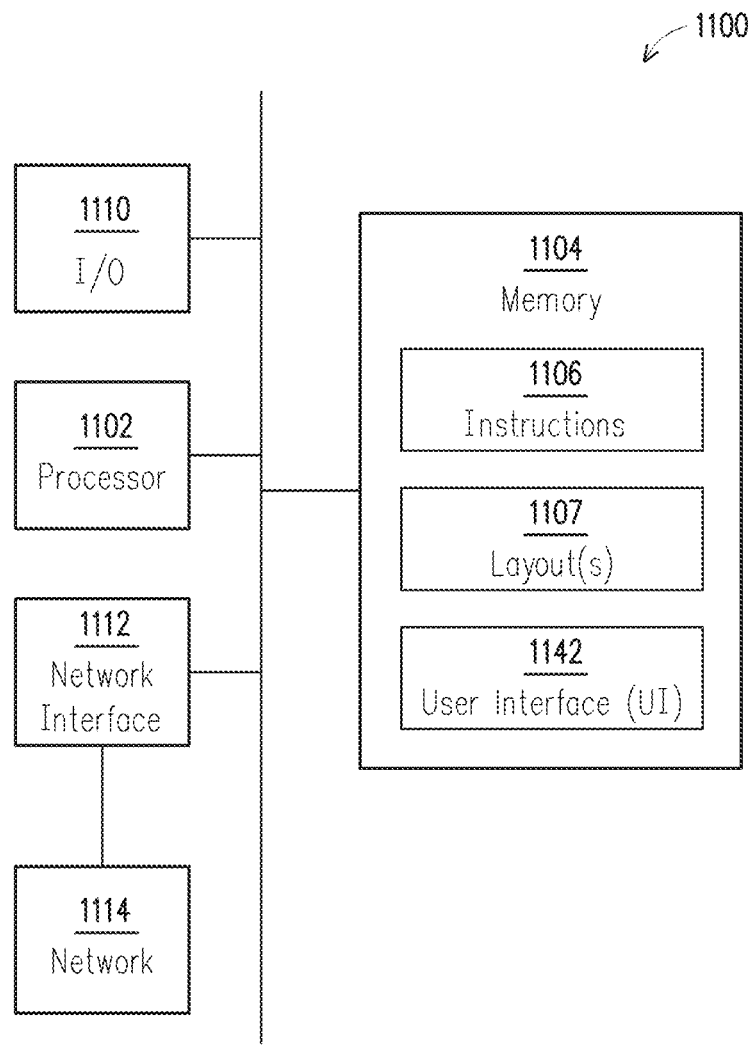
FIG. 11 is a block diagram of an electronic design automation (EDA) system, in accordance with at least one embodiment of the present disclosure.

FIG. 11 is a block diagram of an electronic design automation (EDA) system 1100, in accordance with at least one embodiment of the present disclosure.

In some embodiments, EDA system 1100 includes an APR system. The method of the flowcharts of FIGS. 6 and 10A-10B are implemented, for example, using EDA system 1100, in accordance with some embodiments.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of, e.g., the methods of FIGS. 6 and 10A-10B, in accordance with one or more embodiments (hereinafter, the noted processes and/or methods).

Processor 1102 is electrically coupled to computer-readable storage medium 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause system 1100 to be usable for performing a portion or all of the noted processes and/or methods. Computer-readable storage medium 1104 also includes one or more layouts 1107 generated according to a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores a library (not shown) of standard cells.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

Again, EDA system 1100 includes network interface 1112. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

System 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as user interface (UI) 1142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
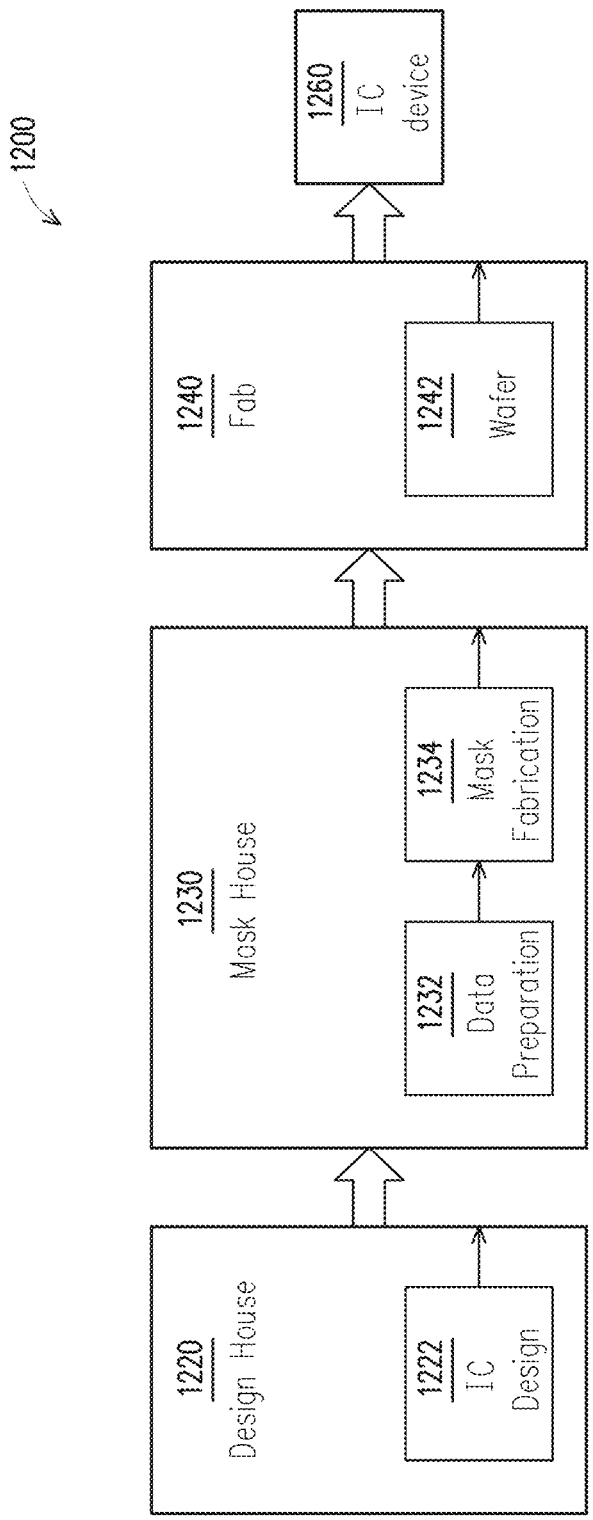
FIG. 12 is a block diagram of an integrated circuit (IC) manufacturing system, and an IC manufacturing flow associated therewith, in accordance with at least one embodiment of the present disclosure.

FIG. 12 is a block diagram of an integrated circuit (IC) manufacturing system 1200, and an IC manufacturing flow associated therewith, in accordance with at least one embodiment of the present disclosure.

In FIG. 12, IC manufacturing system 1200 includes entities, such as a design house 1220, a mask house 1230, and an IC manufacturer/fabricator ("fab") 1240, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1240 is owned by a single larger company. In some embodiments, two or more of design house 1220, mask house 1230, and IC fab 1240 coexist in a common facility and use common resources.

Design house (or design team) 1220 generates an IC design layout 1222. IC design layout 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout 1222. The design procedure includes one or more of logic design, physical design or place and route. IC design layout 1222 is presented in one or more data files having information of the geometrical patterns. For example, IC design layout 1222 can be expressed in a GDSII file format or DFII file format.

Mask house 1230 includes mask data preparation 1232 and mask fabrication 1234. Mask house 1230 uses IC design layout 1222 to manufacture one or more masks to be used for fabricating the various layers of IC device 1260 according to IC design layout 1222. Mask house 1230 performs mask data preparation 1232, where IC design layout 1222 is translated into a representative data file ("RDF"). Mask data preparation 1232 provides the RDF to mask fabrication 1234. Mask fabrication 1234 includes a mask writer. A mask writer converts the RDF to an image on a substrate, such as a mask (reticle) or a semiconductor wafer. The design layout is manipulated by mask data preparation 1232 to comply with particular characteristics of the mask writer and/or requirements of IC fab 1240. In FIG. 12, mask data preparation 1232 and mask fabrication 1234 are illustrated as separate elements. In some embodiments, mask data preparation 1232 and mask fabrication 1234 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1234, which may undo part of the modifications performed by OPC in order to meet mask creation rules.

In some embodiments, mask data preparation 1232 includes lithography process checking (LPC) that simulates processing that will be implemented by IC fab 1240 to fabricate IC device 1260. LPC simulates this processing based on IC design layout 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1222.

It should be understood that the above description of mask data preparation 1232 has been simplified for the purposes of clarity. In some embodiments, mask data preparation 1232 includes additional features such as a logic operation (LOP) to modify the IC design layout according to manufacturing rules. Additionally, the processes applied to IC design layout 1222 during mask data preparation 1232 may be executed in a variety of different orders.

After mask data preparation 1232 and during mask fabrication 1234, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1234 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1240 is an IC fabrication business that includes one or more manufacturing facilities for the fabrication of a variety of different IC products. In some embodiments, IC Fab 1240 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1240 uses the mask (or masks) fabricated by mask house 1230 to fabricate IC device 1260. Thus, IC fab 1240 at least indirectly uses IC design layout 1222 to fabricate IC device 1260. In some embodiments, a semiconductor wafer 1242 is fabricated by IC fab 1240 using the mask (or masks) to form IC device 1260. Semiconductor wafer 1242 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 1200 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

FIGS. 13A and 13B are layout diagrams of a portion of a shifted pillar of an IC structure, in accordance with at least one embodiment of the present disclosure.

In FIG. 13A, a conductive line structure, in an IC, includes first line segment 1302, second line segment 1304, third line segment 1306 and fourth line segment 1308 which are arranged with respect to a grid. The grid includes tracks 1*a*-7*a* which are parallel to a first direction, and tracks 1*b*-17*b* which are parallel to a second direction, the second direction being substantially perpendicular to the first direction. In FIG. 13A, the first direction is vertical and the second direction is horizontal. In some embodiments, the first and second directions are directions other than the corresponding vertical and horizontal directions.

The first 1302 and second 1304 line segments: are conductive; are non-overlapping of each other; and have long axes which are substantially parallel to a first direction. The third 1306 and fourth 1308 line segments: are conductive; are non-overlapping of each other; have long axes which are substantially parallel to a second direction, the second direction being orthogonal to the first direction; and overlap the corresponding first 1302 and second 1304 line segments. The second 1304 and fourth 1308 line segments offset in the first direction relative to the corresponding first 1302 and third 1306 line segments. First 1302 and second 1304 line segments are coaxial with track 4*a*. Third 1306 and fourth 1308 line segments are coaxial with corresponding tracks 4*b* and 14*b*. In some embodiments, line segments 1302-1308 are short pillars.

In FIG. 13A, first line segment 1302 and second line segment 1304 are substantially aligned along track 4*a*. As indicated by the X symbol on track 4*a*, the vertical-separation between first line segment 1302 and second line segment 1304 is less than a design-rule-permitted minimum offset, $MIN_{COAX}$, between vertically-adjacent co-track/coaxial line segments such that FIG. 13A does not comply with the design rule. In some embodiments, a purpose of the design rule is to ensure a vertical-separation which is sufficiently large enough to accommodate minimum length conductive segment between first line segment 1302 and second line segment 1304.

As shown in FIG. 13B, to increase the vertical-separation between vertically-adjacent co-track/coaxial line segments, second line segment 1304 is shifted by a shift-amount, A, in the second direction relative to the first line segment 1302 such that second line segment 1304 is aligned with track 5*a*. In FIG. 13B, the shift-amount A is one track width. In some embodiments, the shift-amount A is a multiple of one track width. In some embodiments, the offset in the amount delta is equal to an offset between neighboring ones of tracks 1*a*-7*a*. The resultant vertical-separation along track 5*a* is equal to or greater than the design-rule-permitted minimum offset $MIN_{COAX}$ between vertically-adjacent co-track/coaxial line segments such that FIG. 13B complies with the design-rule. In FIG. 13B, second line segment 1304 is shifted to the right. In some embodiments, second line segment 1304 is shifted to the left.

In some embodiments the conducting line structure of FIG. 13A includes a fifth line segment (not depicted) and a sixth line segment (not depicted) which are arranged with respect to the grid such that: the fifth line segment also is aligned along track 4*a*; the sixth line segment is substantially aligned along a track 24*b* (not shown); the fifth and sixth line segments overlap similarly to how first 1302 and second 1304 line segments overlap with corresponding third 1306 and fourth 1308 line segments; the vertical-separation between second line segment 1304 and the fifth line segment is less than the design-rule-permitted minimum offset $MIN_{COAX}$ between vertically-adjacent co-track/coaxial line segments. Accordingly, in some embodiments, the fifth and sixth line segments are shifted similarly to how second line segment 1304 and fourth line segment 1308 are shifted in FIG. 13B such that the fifth line segment is shifted by the shift-amount A in the second direction relative to second line segment 1304 such that fifth line segment (again, now shown) becomes aligned with track 6*a*. In some embodiments, in contrast to how second line segment 1304 and fourth line segment 1308 are shifted in FIG. 9B, the fifth and sixth line segments are not shifted relative to first line segment 1302 because the shift of second line segment 1304 and fourth line segment 1308 relative to first line segment 1302 not only achieves adequate vertical-separation (between vertically-adjacent co-track/coaxial line segments) along track 5*a* but also does so for track 4*a* (that latter being between first line segment 1302 and the fifth line segment).

Accordingly, an advantage of FIG. 13B is that a layout incorporating such pillar-shifting has a reduced consumption of routing-resources such that the layout incorporating the conducting line structure is denser. In some embodiments, the portion of track 4*a* below first line segment 1302

(which is otherwise occupied by second line segment 1304 in FIG. 13A) is used for signal routing. In some embodiments, a layout incorporating such a conducting line structure is denser by two or more instances of the first reference line relative to a power pitch. In some embodiments, the power pitch is a distance between a line segment having a voltage level of a first reference voltage and a line segment having a voltage level of a second reference voltage. In some embodiments, the first reference voltage is VDD and the second reference voltage is VSS.

Figures 14A, 14B:
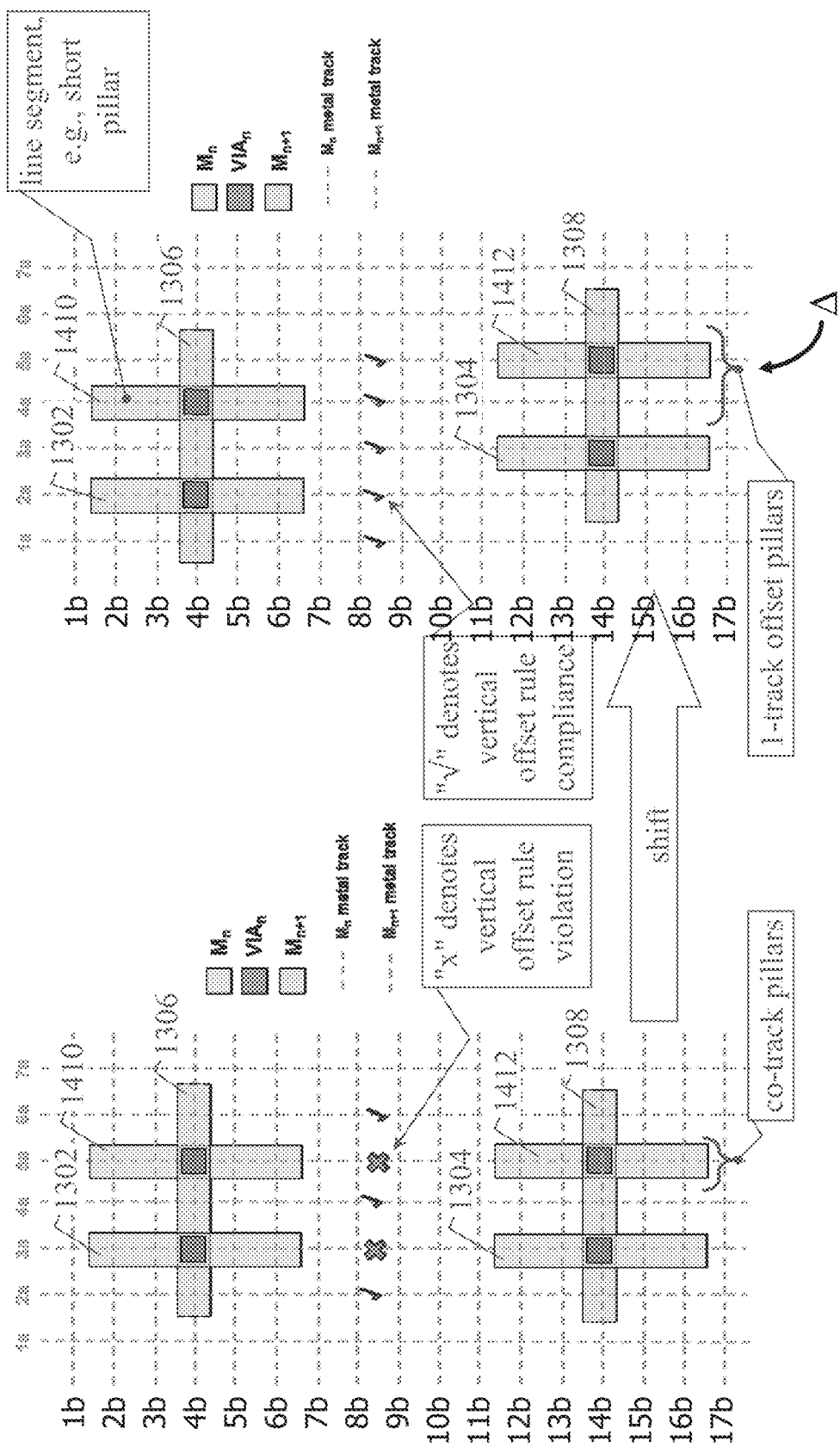
FIGS. 14A-14B are layout diagrams of a portion of two shifted pillars of an IC structure, in accordance with at least one embodiment of the present disclosure.

FIGS. 14A and 14B are layout diagrams of a portion of two shifted pillars of an IC structure, in accordance with at least one embodiment of the present disclosure.

FIGS. 14A-14B are a variation of FIGS. 13A-13B such that FIGS. 14A-14B further include fifth line segment 1410 and sixth line segment 1412 which: are conductive; are non-overlapping of each other; have long axes which are substantially parallel to the first direction; and are overlapped by the corresponding third and fourth line segments. The fifth and sixth line segments are offset in the second direction relative to the corresponding first and second line segments. The sixth line segment is offset by the amount delta, $\Delta$, in the second direction relative to the fifth line segment. In some embodiments in which line segments 1302-1308 are short pillars, line segments 1410 and 1412 also are short pillars.

The conductive line structure, and method for generating a layout of such a conductive line structure, arise in the context of a process node for a given semiconductor technology. In some embodiments, the offset in the amount delta is equal to a poly pitch of the process node.

In some embodiments, the first and second line segments are long pillars. In some embodiments, the third and fourth line segments are long pillars. In some embodiments, the first through fourth line segments are long pillars. In some embodiments, the line segments which are long pillars have a length, $L_L$, less than or equal to a predetermined length, $L_{LIMIT}$, where $L_L \leq L_{LIMIT}$. In some embodiments, $L_{LIMI}$T is substantially equal to, albeit without being greater than, the Blech length, $L_{Blech}$, where $L_{LIMIT} \approx L_{Blech}$ AND $L_{LIMI}T \leq L_{Blech}$. It is noted that $L_{Blech}$ represents a length of conductor below which substantially no electromigration occurs. In some embodiments, $L_{LIMIT}$ is a length other than Blech length, $L_{Blech}$.

In some embodiments, the first and second line segments are short pillars. In some embodiments, the third and fourth line segments are short pillars. In some embodiments, the first through fourth line segments are short pillars. In some embodiments, the line segments which are short pillars have a length, $L_S$, less than the predetermined length, $L_{LIMIT}$, where $L_S < L_{LIMIT}$.

Figure 15:
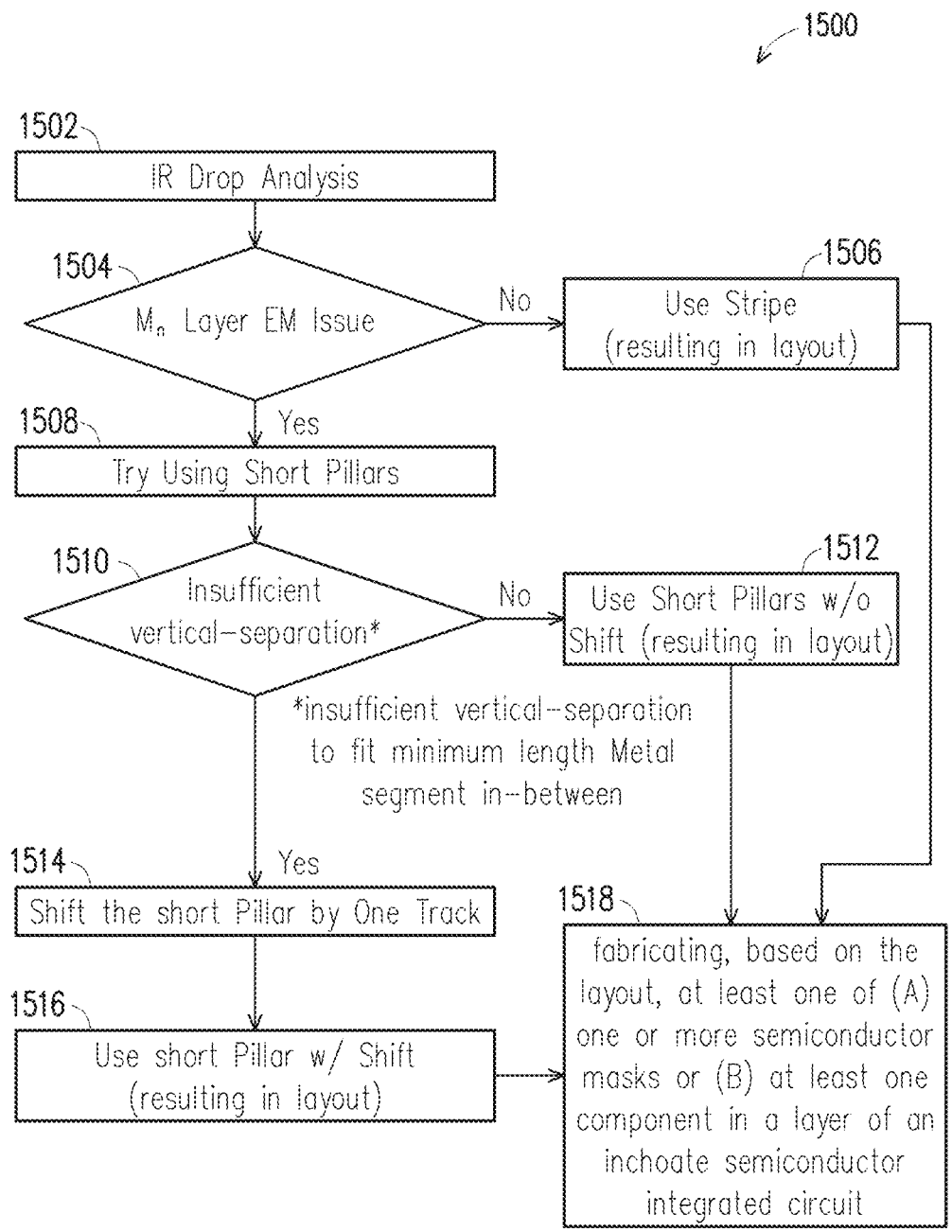
FIG. 15 is a high level process flow of another method of shifting at least one pillar of an IC structure in a layout, in accordance with at least one embodiment of the present disclosure.

FIG. 15 is a high level process flow of a method 1500 of shifting at least one pillar of an IC structure in a layout, in accordance with at least one embodiment of the present disclosure.

In FIG. 15, the flowchart of method 1500 includes blocks 1502-1518. At least one of blocks 1502-1516 is executed by a processor of a computer. An example of the processor is a processor 1102 of FIG. 11 (discussed above). An example of the computer is an electronic design automation (EDA) system 1100 of FIG. 11 (discussed above). In some embodiments, each of blocks is executed by the processor of the computer. In some embodiments, the layout generated by method 1500 is stored on a non-transitory computer-readable medium. An example of the non-transitory computer-readable medium is layout 1107 stored in memory 1104 of FIG. 11 (discussed above).

At block 1502, an IR drop analysis is executed for conductive segments in a layer $M_n$. Assuming that the conductive segments in the $M_n$ layer satisfy the IR drop analysis of block 1502, the process flow then proceeds to block 1504 wherein a determination is made whether there is an electromigration issue in any of one or more stripes in the $M_n$ layer. If the result of block 1504 is negative, then the process flow proceeds to block 1506 in which a stripe is used into the layout, resulting in the layout. In some embodiments, a stripe is a conductive line which is longer than a long pillar (where a length of a long pillar is related to the Blech length, $L_{Blech}$, discussed above). From block 1506, the process flow then proceeds to block 1518 where, based on the layout, at least one of (A) one or more semiconductor masks is fabricated (see FIG. 12, discussed above) or (B) at least one component in a layer of an inchoate semiconductor integrated circuit is fabricated (again, see FIG. 12, discussed above).

If the result of block 1504 is positive, i.e., an electromigration issue is determined in the layout, then the process flow proceeds to block 1508 which tries to use short pillars. Execution of block 1508 causes the insertion of short pillars into the layout in replacement of corresponding stripe(s) having the electromigration issue. An example of the short pillars are short pillars 1302 and 1304 of FIG. 13A. The process flow then proceeds to block 1510 in which a determination is made whether there is insufficient vertical-separation in which to fit a minimum length metal segment in between two given pillars of the IC structure. If the result of block 1510 is negative, the process flow proceeds to block 1512 in which a pillar is used without a shift in position/track-alignment, resulting in the layout such that the two given pillars remain co-track aligned. From block 1512, the process flow then proceeds to block 1518 (discussed above).

If the result of block 1510 is positive, the process flow proceeds to block 1514 in which the pillar position is shifted by one track in a direction perpendicular to the direction in which the insufficient space was determined. The process flow then proceeds to block 1516 in which the shifted pillar is used, resulting in the layout. From block 1516, the process flow then proceeds to block 1518 (discussed above).

In some embodiments, a method of forming an integrated circuit (IC) structure includes forming a first power rail and a second power rail at a power rail level, the first power rail and the second power rail being oriented in a power rail direction; forming a plurality of first metal segments at a first metal level above the power rail level, the plurality of first metal segments being oriented in a first metal level direction perpendicular to the power rail direction, each first metal segment of the plurality of first metal segments overlapping one or both of the first power rail or the second power rail; forming a plurality of first vias between the power rail level and the first metal level, each first via of the plurality of first vias being positioned at a location where a corresponding first metal segment of the plurality of first metal segments overlaps the first power rail or the second power rail; forming a plurality of second metal segments at a second metal level above the first metal level, each second metal segment of the plurality of second metal segments being oriented in the power rail direction, at least one second metal segment of the plurality of second metal segments overlapping the first power rail, and at least one second metal segment of the plurality of second metal segments overlapping the second power rail; forming a plurality of second vias between the first metal level and the second metal level, each second via of the plurality of second vias being positioned at a location above a corresponding first via of the plurality of first vias; forming a first power strap at a power strap level above the second metal level; and forming a second power strap at the power strap level; where the forming the IC structure further includes configuring the IC structure to electrically connect the first power strap to the first power rail and to electrically connect the second power strap to the second power rail; the forming the plurality of first metal segments includes forming each first metal segment of the plurality of first metal segments having a width corresponding to a predetermined minimum width for the first metal level; the forming the first power strap includes forming the first power strap having a width greater than a predetermined minimum width for the power strap level; and the forming the second power strap includes forming the second power strap having the width greater than the predetermined minimum width for the power strap level.

In some embodiments, the forming the plurality of first metal segments includes forming a first set of pairs of first metal segments alternating with a second set of pairs of first metal segments; each pair of first metal segments of the first set of pairs of first metal segments and of the second set of pairs of first metal segments has a first pitch; the pairs of first metal segments of the first set of pairs of first metal segments and the pairs of first metal segments of the second set of pairs of first metal segments have a second pitch; and the second pitch is a multiple of the first pitch; and the forming the plurality of second metal segments includes forming a first set of second metal segments overlapping the first set of pairs of first metal segments and the first power rail; forming a second set of second metal segments overlapping the second set of pairs of first metal segments and the second power rail; and forming each second metal segment of the plurality of second metal segments having a width corresponding to a predetermined minimum width for the second metal level.

In some embodiments, the forming the plurality of second metal segments includes forming a first set of second metal segments overlapping corresponding first metal segments of the plurality of first metal segments and the first power rail; forming a second set of second metal segments overlapping corresponding first metal segments of the plurality of first metal segments and the second power rail; and forming each second metal segment of the plurality of second metal segments having a width corresponding to a predetermined minimum width for the second metal level; and the forming the IC structure further includes forming a plurality of third metal segments at a third metal level above the second metal level, the plurality of third metal segments being oriented in the first metal level direction and including a first set of third metal segments alternating with a second set of third metal segments; the forming the first set of third metal segments includes forming third metal segments overlapping corresponding second metal segments of the first set of second metal segments; the forming the second set of third metal segments includes forming third metal segments overlapping corresponding second metal segments of the second set of second metal segments; and the forming the plurality of third metal segments includes forming each third metal segment of the plurality of third metal segments having a width corresponding to a predetermined minimum width for the third metal level.

In some embodiments, the forming the plurality of first vias includes forming a via at each location where the first metal segments of the plurality of first metal segments overlap the first power rail and at each location where the first metal segments of the plurality of first metal segments overlap the second power rail; the forming the plurality of second metal segments includes forming each second metal segment overlapping multiple first metal segments of the plurality of first metal segments and having a width wider than a predetermined minimum width for the second metal segment; and the forming the IC structure further includes forming a plurality of third metal segments at a third metal level immediately above the second metal level, the plurality of third metal segments being oriented in the first metal level direction and including a first set of third metal segments alternating with a second set of third metal segments; the forming the plurality of third metal segments includes forming each third metal segment of the plurality of third metal segments overlapping the first power rail and the second power rail and having a width corresponding to a predetermined minimum width for the third metal level; and forming a plurality of third vias, the plurality of third vias electrically connecting the first set of third metal segments to the at least one second metal segment of the plurality of second metal segments overlapping the first power rail and electrically connecting the second set of third metal segments to the at least one second metal segment of the plurality of second metal segments overlapping the second power rail.

In some embodiments, a method of forming an integrated circuit (IC) structure includes forming a conductive line structure in the IC structure, the forming the conductive line structure including forming first and second sets of long pillars resulting in the following: members of each of the first and second sets of long pillars having long axes that extend in a first direction; for each of the first and second sets of long pillars, the members correspondingly thereof being non-overlapping of each other with respect to the first direction; and the second sets of long pillars being offset in a second direction relative to the first set of long pillars, the second direction being orthogonal to the first direction; forming a third set of short pillars resulting in the following: members of the third set of short pillars being non-overlapping of each other; the members of the third set of short pillars having long axes that extend in the second direction; the members of the third set of short pillars being overlapping of corresponding long pillars in the first and second sets of long pillars; the third set of short pillars being organized into groups, each of the groups having a first quantity of short pillars; for each of the groups of the third set of short pillars, each member of the group correspondingly overlapping a pair, the pair including one member from each of the first and second sets of long pillars; each long pillar in each of the first and second sets of long pillars being overlapped by a second quantity of corresponding short pillars in the third set; and the first quantity of short pillars being less than the second quantity of corresponding short pillars; and forming first vias which electrically connect the members of the third set of short pillars correspondingly with the members of the first and second sets of long pillars resulting in the following: each short pillar overlaps and is electrically connected between a corresponding one of the pairs; and each long pillar in each of the first and second sets of long pillars that is overlapped by the second quantity of corresponding short pillars in the third set being electrically connected to the same.

In some embodiments, the forming the third set of short pillars further results in the members of the third set of short pillars having corresponding first ends which are aligned relative to the second direction.

In some embodiments, the method further includes forming fourth and fifth sets of long pillars resulting in the following: members of each of the fourth and fifth sets of long pillars being non-overlapping of each other; and the members of each of the fourth and fifth sets of long pillars having long axes that extend in the first direction; and the members of the fifth sets of long pillars being offset in the second direction relative to the fourth sets of long pillars.

In some embodiments, the method further includes forming a sixth set of short pillars resulting in the following: the short pillars being non-overlapping of each other and having long axes which extend in the second direction; members of the sixth set of short pillars overlapping corresponding long pillars in the fourth and fifth sets of long pillars; and the sixth set of short pillars being organized into groups, each group having the first quantity of short pillars.

In some embodiments, the forming fourth and fifth sets of long pillars further results in the following: the fourth set of long pillars being offset in the second direction by a first distance relative to a first set of long pillars; and the fifth set of long pillars being offset in the second direction by the first distance relative to a second set; and the forming a sixth set of short pillars further results in the following: the sixth set of short pillars being offset in the first direction by a second distance relative to the third set of short pillars; and each short pillar in each group of the sixth set of short pillars overlaps a corresponding member of the fourth set of long pillars and a corresponding member of the fifth set of long pillars; each long pillar in each of the fourth and fifth sets of long pillars being overlapped by the second quantity of corresponding short pillars in the sixth set of short pillars; and the method further includes: forming second vias which electrically connect the sixth set of short pillars with corresponding members of the fourth and fifth sets long pillars.

In some embodiments, the forming the second set of long pillars further results in the following: the second set of long pillars being offset in the second direction by a third distance relative to the first set of long pillars; and the forming fourth and fifth sets of long pillars further results in the following: the fifth set of long pillars being offset in the second direction by the third distance relative to the fourth set of long pillars; and wherein the third distance is less than the first distance.

In some embodiments, the forming first and second sets of long pillars further results in the following: members of the first and second sets of long pillars being in a M(i) metallization layer of the IC, where i is a non-negative integer; and the forming a third set of short pillars further results in the following: members of the third set of short pillars being in a M(i+1) metallization layer of the IC.

In some embodiments, a method of forming an integrated circuit (IC) structure includes forming a conductive line structure in the IC, the forming the conductive line structure including: forming line segments resulting in the following: the line segments being non-overlapping of each other; the line segments having long axes that extend in a first direction; and the line segments being offset in a second direction relative to each other, the second direction being orthogonal to the first direction; forming long pillars organized into sets resulting in the following: member long pillars of each set being non-overlapping of each other; the long pillars having long axes that extend in the second direction; the long pillars being offset in the first direction relative to each other; the long pillars being overlapping of corresponding ones of the line segments; the long pillars being organized into groups; the groups being offset from each other relative to the first direction; each of the groups having a same quantity of the long pillars; for each of the groups, the member long pillars thereof being offset relative to the first direction; for each of the groups, member long pillars thereof being non-overlapping of each other relative to the first direction; for each of the groups, the member long pillars thereof having corresponding first ends which are aligned relative the second direction; and forming vias which electrically connect the long pillars with corresponding ones of the line segments.

In some embodiments, the forming long pillars further results in the following: members of each set aligned in the first direction being offset in the second direction relative to each other.

In some embodiments, the forming line segments further results in the following: the line segments being organized into bunches, each bunch including J clusters, each cluster including K line segments, and J and K being positive integers.

In some embodiments, the forming line segments further results in the following: within each of the J clusters, adjacent members of the cluster being offset from each other in the second direction by a first distance; and adjacent clusters being offset from each other in the second direction by a second distance, the second distance being greater than the first distance; and for each of the sets of long pillars, the line segments thereof correspondingly overlapping J−1 clusters.

In some embodiments, the forming vias further results in the following: for each of the sets of long pillars, the line segments for each set of long pillars being electrically connected to each of members of J−2 clusters.

In some embodiments, the forming the line segments further results in the following: the line segments in a first one of the sets of long pillars being organized into first and second clusters.

In some embodiments, the forming line segments further results in the following: adjacent members of the first cluster being offset from each other in the second direction by a first distance; adjacent members of the second cluster being offset from each other in the second direction by the first distance; members of the second cluster being offset in the second direction by a second distance relative to corresponding members of the first cluster; and wherein the second distance is greater than the first distance.

In some embodiments, the forming line segments further results in the following: the line segments being located in a M(i) metallization layer of the IC, where i is a non-negative integer; and members of F sets being located in a M(i+1) metallization layer of the IC, F being a positive integer.

In some embodiments, the forming long pillars further results in the following: for a reference portion of each of the line segments, a first number of the long pillars which overlaps the reference portion is greater than a second number of long pillars which are electrically connected to the reference portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit structure, the method comprising:
   forming a first power rail and a second power rail at a power rail level, the first power rail and the second power rail being oriented in a power rail direction;
   forming a plurality of first metal segments at a first metal level above the power rail level, the plurality of first metal segments being oriented in a first metal direction perpendicular to the power rail direction, each first metal segment of the plurality of first metal segments overlapping one or both of the first power rail or the second power rail;
   forming a plurality of first vias between the power rail level and the first metal level, each first via of the plurality of first vias being positioned at a location where a corresponding first metal segment of the plurality of first metal segments overlaps the first power rail or the second power rail;
   forming a plurality of second metal segments at a second metal level above the first metal level, each second metal segment of the plurality of second metal segments being oriented in the power rail direction, the forming a plurality of second metal segments including aligning corresponding ones of the plurality of second metal segments to form first and second sets relative to the first metal direction, the first set of second metal segments overlapping the first power rail but being free from overlapping the second power rail relative to the first metal direction, and the second set of second metal segments overlapping the second power rail but being free from overlapping the first power rail relative to the first metal direction;
   forming a plurality of second vias between the first metal level and the second metal level, each second via being positioned at a location above a corresponding first via of the plurality of first vias;
   forming a first power strap level at a power strap level above the second metal level;
   forming a second power strap at the power strap level; and
   wherein:
      the forming the IC structure further includes:
         configuring the IC structure to electrically connect the first power strap to the first power rail and to electrically connect the second power strap to the second power rail;
      the forming the plurality of first metal segments includes:
         forming each first metal segment of the plurality of first metal segments having a width corresponding to a predetermined minimum width for the first metal level;
      the forming the first power strap includes:
         forming the first power strap having a width greater than a predetermined minimum width for the power strap level; and
      the forming the second power strap includes:
         forming the second power strap having the width greater than the predetermined minimum width for the power strap level.

2. The method of claim 1, wherein:
   the forming the plurality of first metal segments includes:
      forming a first set of pairs of first metal segments alternating with a second set of pairs of first metal segments;
      each pair of first metal segments of the first set of pairs of first metal segments and of the second set of pairs of first metal segments has a first pitch;
      the pairs of first metal segments of the first set of pairs of first metal segments and the pairs of first metal segments of the second set of pairs of first metal segments have a second pitch; and
      the second pitch is a multiple of the first pitch; and
   the forming the plurality of second metal segments includes:
      forming each second metal segment of the plurality of second metal segments having a width corresponding to a predetermined minimum width for the second metal level.

3. The method of claim 1, wherein:
   the forming the plurality of second metal segments includes:
      forming each second metal segment of the plurality of second metal segments having a width corresponding to a predetermined minimum width for the second metal level; and
   the forming the IC structure further includes:
      forming a plurality of third metal segments at a third metal level above the second metal level, the plurality of third metal segments being oriented in the first metal level direction and including a first set of third metal segments alternating with a second set of third metal segments;
   the forming the first set of third metal segments includes:
      forming third metal segments overlapping corresponding second metal segments of the first set of second metal segments;
   the forming the second set of third metal segments includes:
      forming third metal segments overlapping corresponding second metal segments of the second set of second metal segments; and
   the forming the plurality of third metal segments includes:
      forming each third metal segment of the plurality of third metal segments having a width corresponding to a predetermined minimum width for the third metal level.

4. The method of claim 1, wherein:
   the forming the plurality of first vias includes:
      forming a via at each location where the first metal segments of the plurality of first metal segments overlap the first power rail and at each location where the first metal segments of the plurality of first metal segments overlap the second power rail;
   the forming the plurality of second metal segments includes:
      forming each second metal segment to have a width wider than a predetermined minimum width for the second metal segment; and
   the forming the IC structure further includes:
      forming a plurality of third metal segments at a third metal level immediately above the second metal level, the plurality of third metal segments being oriented in the first metal level direction and including a first set of third metal segments alternating with a second set of third metal segments;
   the forming the plurality of third metal segments includes:
      forming each third metal segment of the plurality of third metal segments overlapping the first power rail and the second power rail and having a width corresponding to a predetermined minimum width for the third metal level; and forming a plurality of third vias, the plurality of third vias electrically connecting the first set of third metal segments to at least one of the plurality of second metal segments overlapping the first power rail and electrically connecting the second set of third metal segments to at least one of the plurality of second metal segments overlapping the second power rail.

5. A method of forming an integrated circuit (IC) structure, the method comprising:
  forming a conductive line structure in the IC structure, the forming the conductive line structure including:
    forming first and second sets of long pillars resulting in the following:
      members of each of the first and second sets of long pillars having long axes that extend in a first direction;
      for each of the first and second sets of long pillars, the members correspondingly thereof being non-overlapping of each other with respect to the first direction and being substantially coaxial; and
      the second set of long pillars being offset in a second direction relative to the first set of long pillars, the second direction being orthogonal to the first direction;
    forming a third set of short pillars resulting in the following:
      members of the third set of short pillars being non-overlapping of each other;
      the members of the third set of short pillars having long axes that extend in the second direction;
      the members of the third set of short pillars being overlapping of corresponding long pillars in the first and second sets of long pillars;
      the third set of short pillars being organized into groups, each of the groups having a first quantity of short pillars;
      for each of the groups of the third set of short pillars, each member of the group correspondingly overlapping a pair, the pair including one member from each of the first and second sets of long pillars;
      each long pillar in each of the first and second sets of long pillars being overlapped by a second quantity of corresponding short pillars in the third set; and
      the first quantity of short pillars being less than the second quantity of corresponding short pillars; and
    forming first vias which electrically connect the members of the third set of short pillars correspondingly with the members of the first and second sets of long pillars resulting in the following:
      each short pillar overlaps and is electrically connected between a corresponding one of the pairs; and
      each long pillar in each of the first and second sets of long pillars that is overlapped by the second quantity of corresponding short pillars in the third set being electrically connected to the second quantity of corresponding short pillars in the third set.

6. The method of forming an IC structure of claim 5, wherein:
  the forming the third set of short pillars further results in the members of the third set of short pillars having corresponding first ends which are aligned relative to the second direction.

7. The method of forming an IC structure of claim 5, further comprising:
  forming fourth and fifth sets of long pillars resulting in the following:
    members of each of the fourth and fifth sets of long pillars being non-overlapping of each other; and
    the members of each of the fourth and fifth sets of long pillars having long axes that extend in the first direction; and
    the members of the fifth sets of long pillars being offset in the second direction relative to the fourth sets of long pillars.

8. The method of forming an IC structure of claim 7, further comprising:
  forming a sixth set of short pillars resulting in the following:
    the short pillars being non-overlapping of each other and having long axes which extend in the second direction;
    members of the sixth set of short pillars overlapping corresponding long pillars in the fourth and fifth sets of long pillars; and
    the sixth set of short pillars being organized into groups, each group having the first quantity of short pillars.

9. The method of forming an IC structure of claim 8, wherein:
  the forming fourth and fifth sets of long pillars further results in the following:
    the fourth set of long pillars being offset in the second direction by a first distance relative to a first set of long pillars; and
    the fifth set of long pillars being offset in the second direction by the first distance relative to a second set; and
  the forming a sixth set of short pillars further results in the following:
    the sixth set of short pillars being offset in the first direction by a second distance relative to the third set of short pillars; and
    each short pillar in each group of the sixth set of short pillars overlaps a corresponding member of the fourth set of long pillars and a corresponding member of the fifth set of long pillars;
    each long pillar in each of the fourth and fifth sets of long pillars being overlapped by the second quantity of corresponding short pillars in the sixth set of short pillars; and
  the method further comprises:
    forming second vias which electrically connect the sixth set of short pillars with corresponding members of the fourth and fifth sets long pillars.

10. The method of forming an IC structure of claim 9, wherein:
  the forming the second set of long pillars further results in the following:
    the second set of long pillars being offset in the second direction by a third distance relative to the first set of long pillars; and
  the forming fourth and fifth sets of long pillars further results in the following:
    the fifth set of long pillars being offset in the second direction by the third distance relative to the fourth set of long pillars; and
  wherein the third distance is less than the first distance.

11. The method of forming an IC structure of claim 5, wherein:
the forming first and second sets of long pillars further results in the following:
members of the first and second sets of long pillars being in a M(i) metallization layer of the IC, where i is a non-negative integer; and
the forming a third set of short pillars further results in the following:
members of the third set of short pillars being in a M(i+1) metallization layer of the IC.

12. A method of forming an integrated circuit (IC) structure, the method comprising:
forming a conductive line structure in the IC, the forming the conductive line structure including:
forming line segments resulting in the following:
the line segments being non-overlapping of each other;
the line segments having long axes that extend in a first direction; and
the line segments being offset in a second direction relative to each other, the second direction being orthogonal to the first direction;
forming long pillars organized into sets resulting in the following:
the long pillars having long axes that extend in the second direction;
member long pillars of each set being separated from each other relative to the first direction;
the long pillars being offset in the first direction relative to each other;
the long pillars being overlapping of corresponding ones of the line segments;
the long pillars being organized further into groups;
the groups being offset from each other relative to each of the first direction and the second direction;
each of the groups having a same quantity of the long pillars;
for each of the groups, the member long pillars thereof being offset relative to the first direction;
for each of the groups, member long pillars thereof being non-overlapping of each other relative to the first direction;
for each of the groups, the member long pillars thereof having corresponding first ends which are aligned relative the second direction; and
forming vias which electrically connect the long pillars with corresponding ones of the line segments.

13. The method of claim 12, wherein the forming long pillars further results in the following:
members of each set aligned in the first direction being offset in the second direction relative to each other.

14. The method of claim 12, wherein the forming line segments further results in the following:
the line segments being organized into bunches, each bunch including J clusters, each cluster including K line segments, and J and K being positive integers.

15. The method of claim 14, wherein:
the forming line segments further results in the following:
within each of the J clusters, adjacent members of the cluster being offset from each other in the second direction by a first distance; and
adjacent clusters being offset from each other in the second direction by a second distance, the second distance being greater than the first distance; and
for each of the sets of long pillars, the line segments thereof correspondingly overlapping J-1 clusters.

16. The method of claim 15, wherein:
the forming vias further results in the following:
for each of the sets of long pillars, the line segments for each set of long pillars being electrically connected to each of members of J-2 clusters.

17. The method of claim 12, wherein the forming the line segments further results in the following:
the line segments in a first one of the sets of long pillars being organized into first and second clusters.

18. The method of claim 17, wherein:
the forming line segments further results in the following:
adjacent members of the first cluster being offset from each other in the second direction by a first distance;
adjacent members of the second cluster being offset from each other in the second direction by the first distance;
members of the second cluster being offset in the second direction by a second distance relative to corresponding members of the first cluster; and
wherein the second distance is greater than the first distance.

19. The method of claim 12, wherein:
the forming line segments further results in the following:
the line segments being located in a M(i) metallization layer of the IC, where i is a non-negative integer; and
members of F sets being located in a M(i+1) metallization layer of the IC, F being a positive integer.

20. The method of claim 12, wherein:
the forming long pillars further results in the following:
for a reference portion of each of the line segments, a first number of the long pillars which overlaps the reference portion is greater than a second number of long pillars which are electrically connected to the reference portion.

* * * * *